(12) United States Patent
Mohanadass et al.

(10) Patent No.: US 12,703,918 B2
(45) Date of Patent: Aug. 11, 2026

(54) JIG FOR ALIGNMENT IN RELATION TO A PROCESS CHAMBER, AND RELATED APPARATUS, SYSTEMS, AND METHODS

(71) Applicant: Applied Materials, Inc., Santa Clara, CA (US)

(72) Inventors: Kalaivanan Mohanadass, Santa Clara, CA (US); Shu-Kwan Lau, Sunnyvale, CA (US); Daniel Coschigano, Beacon, NY (US); Jayanth Devaraja Swamy, Bangalore (IN)

(73) Assignee: Applied Materials, Inc., Santa Clara, CA (US)

( * ) Notice: Subject to any disclaimer, the term of this patent is extended or adjusted under 35 U.S.C. 154(b) by 487 days.

(21) Appl. No.: 18/140,295

(22) Filed: Apr. 27, 2023

(65) Prior Publication Data

US 2024/0360560 A1 Oct. 31, 2024

(51) Int. Cl.
*C23C 16/52* (2006.01)
*C23C 16/46* (2006.01)
*G01S 17/08* (2006.01)

(52) U.S. Cl.
CPC .............. *C23C 16/52* (2013.01); *C23C 16/46* (2013.01); *G01S 17/08* (2013.01)

(58) Field of Classification Search
CPC ........... H01J 37/32715; H01J 37/32733; H01J 37/32935; H01J 37/32724; H01J 37/32917; G01B 11/27; G01B 5/0009; C23C 16/46; C23C 16/52; C23C 16/4584; C23C 16/482; C23C 16/4586; C23C 16/4585; H01L 21/37115; H01L 21/68742; H01L 21/681; H01L 21/67259; G01S 17/08
See application file for complete search history.

(56) References Cited

U.S. PATENT DOCUMENTS 4,932,067 A 6/1990 Pester et al.
5,135,695 A * 8/1992 Marcus .................. C23C 16/01 264/141
5,431,498 A 7/1995 Lyon
8,372,203 B2 2/2013 Chacin et al.
(Continued)

FOREIGN PATENT DOCUMENTS

KR 2022-0090926 A 6/2022

OTHER PUBLICATIONS

International Search Report and Written Opinion in related application PCT/US2024/012078 dated May 7, 2024.
(Continued)

*Primary Examiner* — Seahee Hong
(74) *Attorney, Agent, or Firm* — Patterson + Sheridan, LLP

(57) ABSTRACT

An alignment assembly includes a sensor and a lid that includes a first window. The alignment assembly also includes a rotary joint coupled to the lid. The alignment assembly also includes a jig coupled to the rotary joint and pivotable relative to the lid about the rotary joint. The jig includes an extendable arm that is moveable from a retracted position where the sensor is disposed in a first position above the first window to an extended position where the sensor is disposed at a second position above the first window. The alignment assembly also includes a lock configured to selectively pivotably lock the jig to the lid and also to selectively lock the extendable arm in the retracted position or the extended position.

15 Claims, 10 Drawing Sheets

(56) References Cited

U.S. PATENT DOCUMENTS

| | | | | |
|---|---|---|---|---|
| 8,702,309 | B2 | 4/2014 | Ng | |
| 9,689,426 | B2 | 6/2017 | Ng et al. | |
| 2009/0092470 | A1 | 4/2009 | Bonora | |
| 2015/0226257 | A1 | 8/2015 | Ng | |
| 2017/0125308 | A1* | 5/2017 | Hung | H10P 74/203 |
| 2018/0254208 | A1* | 9/2018 | Chang | H10P 72/0602 |
| 2019/0355604 | A1 | 11/2019 | Kawabe | |
| 2020/0083075 | A1* | 3/2020 | Kwon | C23C 16/52 |
| 2021/0082729 | A1 | 3/2021 | Hansen | |
| 2022/0090293 | A1* | 3/2022 | Moradian | C30B 25/10 |
| 2022/0395986 | A1 | 12/2022 | Blank et al. | |
| 2023/0064941 | A1* | 3/2023 | Lee | H10P 72/53 |

OTHER PUBLICATIONS

Thomson; Specification Sheet; 500 Series Ball Carriage, 511H15C0; 4 pages; retrieved from the internet https://www.thomsonlinear.com/en/product/511H15C0.

TPA Motion; TTS2 Turntable Bearing Products; Technical Data Sheet; 3 pages; Retrieved from the Internet: https://www.tpamotion.com/turntable-bearings.html.

Korean Office Action for Application No. 10-2025-7033299 dated Mar. 30, 2026.

* cited by examiner 280
286
214
217
215
215
217
217
252
250
290
222
221
220
220
224
240
230
192

280
286
214
214
212
210
212
211
252
A1
222
221
220
220
224
240
230
192

280
210
211
252
254
221
290
260
220
230
240
184
192
430
422
106
421
401
X1
411
X2
412
107

JIG FOR ALIGNMENT IN RELATION TO A PROCESS CHAMBER, AND RELATED APPARATUS, SYSTEMS, AND METHODS

BACKGROUND

Field

The present disclosure relates to semiconductor process chambers, and more specifically to analyzing the alignment between components within the process chamber.

Description of the Related Art

Process chambers are used to manufacture semiconductor devices. The process chambers include substrate supports that rotate within the chamber and support the substrate during processing. If the substrate support becomes misaligned within the process chamber, then the substrate support can contact another component within the process chamber. This contact may damage components within the chamber and generate particles that interfere with the formation of semiconductor devices on the substrate. Moreover, apparatus that determine alignment of the substrate support can be limited with respect to chamber configuration There is a need in the art for a system to determine the alignment of the a variety of different models of substrate supports within the process chamber, including using the same sensor to measure different parts of the substrate support.

SUMMARY

The present disclosure relates to semiconductor process chambers, and more specifically to analyzing the alignment between components within the process chamber. In one or more embodiments, an alignment between a substrate support and an outer structure (such as a pre-heat ring) is determined.

In one or more embodiments, a jig for mounting to a substrate process chamber applicable for use in semiconductor manufacturing includes a base arm that includes at least one base opening. The jig includes an extendable arm that includes a first opening and a second opening offset from each other by a distance, and the first opening is aligned with at least part of the at least one base opening when the extendable arm is in a retracted position. The second opening is aligned with at least part of the at least one base opening when the extendable arm is in an extended position. The jig includes a sensor mount coupled to a first end of the extendable arm, and a guide rail assembly. The guide rail assembly includes at least one rail, and a carriage engaged with the at least one rail and coupled to the extendable arm. The carriage is moveable along the at least one rail to move the extendable arm between the retracted position and the extended position.

In one or more embodiments, an alignment assembly includes a sensor, a lid that includes a first window, a rotary joint coupled to the lid, and a jig coupled to the rotary joint and pivotable relative to the lid about the rotary joint. The jig includes an extendable arm that is moveable: from a retracted position where the sensor is disposed in a first position above the first window, and to an extended position where the sensor is disposed at a second position above the first window. The alignment assembly includes a lock configured to selectively pivotably lock the jig to the lid and also to selectively lock the extendable arm in the retracted position or the extended position.

In one or more embodiments, a method of positioning a sensor includes pivoting a jig mounted to a lid of a process chamber to a first pivot position to place a sensor connected to an extendable arm of the jig above a first window of the lid. The method includes adjusting a position of the extendable arm relative to a base arm of the jig to dispose the sensor at a first position above the first window. The method includes locking the sensor in the first position above the first window by inserting a lock pin through the extendable arm, the base arm, and into a first lock opening formed in the lid.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments of the disclosure and are therefore not to be considered limiting of its scope, as the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

An apparatus and methods for determining an alignment of a substrate support in situ are disclosed herein. In one or more embodiments, an alignment between a substrate support and an outer structure (such as a pre-heat ring) is determined.

Figure 1:
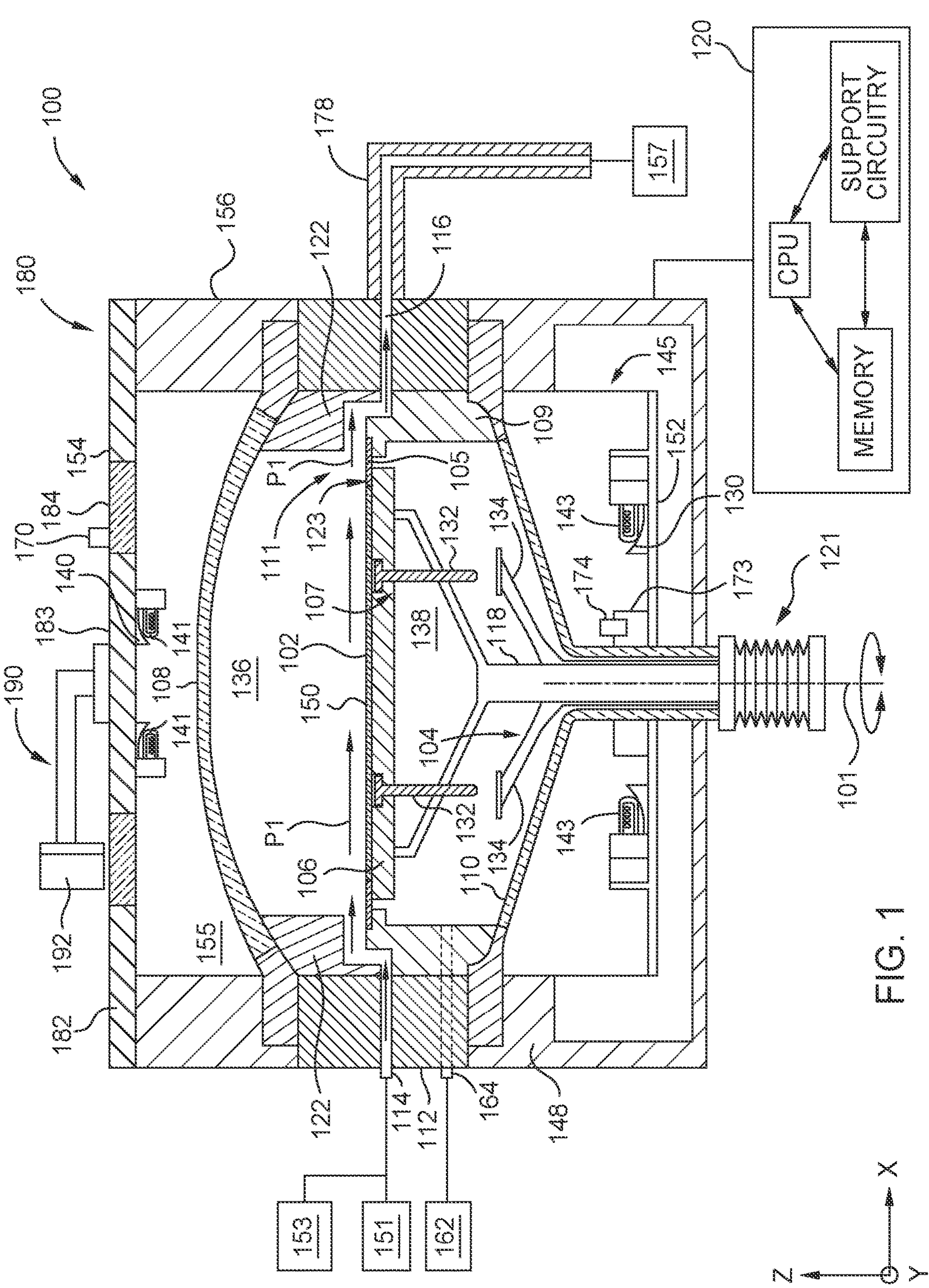
FIG. 1 is a partial schematic side cross-sectional view of an exemplary processing chamber.

FIG. 1 is a partial schematic side cross-sectional view of a process chamber 100 including a process kit 111, according to one or more embodiments. The process chamber 100 is a deposition chamber. In one or more embodiments, the process chamber 100 is an epitaxial deposition chamber. The process chamber 100 is utilized to grow an epitaxial film on a substrate 102. The process chamber 100 creates a cross-flow of precursors across a top surface 150 of the substrate 102. In one or more embodiments, the process chamber 100 is used for rapid thermal processing. The process chamber 100 can operate under vacuum, such as, at reduced pressures or near atmospheric pressure. Other pressure values are contemplated.

The process chamber 100 includes an upper body 156, a lower body 148 disposed below the upper body 156, and a flow module 112 disposed between the upper body 156 and the lower body 148. The upper body 156, the flow module 112, and the lower body 148 form at least part of a chamber body. Disposed within the chamber body is a substrate support 106, an upper window 108 (such as an upper dome), a lower window 110 (such as a lower dome), a plurality of upper heat sources 141, and a plurality of lower heat sources 143. As shown, a controller 120 is in communication with the process chamber 100 and is used to control processes and methods, such as the operations of the methods described herein. FIG. 1 also includes an X,Y,Z coordinate system to illustrate different axial directions along the process chamber 100.

In one or more embodiments, the heat sources (such as the heat sources 141, 43) discussed herein include radiant heat sources such as lamps, for example halogen lamps. The present disclosure contemplates that other heat sources may be used (in addition to or in place of the lamps) for the various heat sources described herein. For example, resistive heaters, light emitting diodes (LEDs), and/or lasers may be used for the various heat sources described herein.

The upper window 108 and the lower window 110 are formed of an energy transmissive material, such as quartz, and may be transparent in one or more embodiments, to allow heat to pass from the upper heat sources 141 and lower heat sources 143 to the substrate 102 and/or the substrate support 106.

A process volume 136 and a purge volume 138 are formed between the upper window 108 and the lower window 110. The process volume 136 and the purge volume 138 are part of an internal volume defined at least partially by the upper window 108, the lower window 110, an upper liner 122, and one or more lower liners 109.

The substrate support 106 is disposed between the upper window 108 and the lower window 110 within the internal volume. The substrate support 106 includes an upper surface on which the substrate 102 is disposed. The substrate support 106 is attached to a shaft 118. The shaft 118 is connected to a motion assembly 121. The motion assembly 121 includes one or more actuators and/or adjustment devices that provide movement and/or adjustment for the shaft 118 and/or the substrate support 106 within the processing volume 136. For example, the motion assembly 121 can adjust the vertical position (e.g., in the Z-direction) of the substrate support 106. The motion assembly 121 can adjust the lateral position (e.g., position in one or both of the X, Y directions). Additionally, the motion assembly 121 may be used to adjust the tilt of the substrate support 106. For example, the motion assembly 121 may pivot the substrate support 106 in the X-Z plane and/or the Y-Z plane. The substrate support 106 is rotatable about a central axis 101 relative to a pre-heat ring 105. The motion assembly 121 may rotate the substrate support 106.

The substrate support 106 may include lift pin holes 107 disposed therein. The lift pin holes 107 are sized to accommodate lift pins 132 for lowering and lifting of the substrate 102 to and from the substrate support 106 before or after a deposition process is performed. The lift pins 132 may rest on lift pin stops 134 when the substrate support 106 is lowered from a process position to a transfer position. The lift pin stops 134 can be coupled to a second shaft 104 through a plurality of arms.

The pre-heat ring 105 is disposed outwardly of the substrate support 106. The pre-heat ring 105 is supported on a ledge of the one or more lower liners 109. In one or more embodiments, the pre-heat ring 105 and/or the liners 109, 113, and/or 122 are formed of one or more of quartz (such as transparent quartz, e.g. clear quartz; opaque quartz, e.g., white quartz; quartz with impregnated particles such as SiC or Si; and/or black quartz), silicon carbide (SiC), and/or graphite coated with SiC.

A lid assembly 180 is coupled to the upper body 156. The lid assembly 180 includes a lid 182 (e.g., lid plate) that has a plurality of windows 184. An extendable jig 190 is disposed on the outer surface 183 of the lid 182. A sensor 192 is mounted to the jig 190. The jig 190 is used to position the sensor 192 above a window 184 and an interface between the substrate support 106 and the pre-heat ring 105. The sensor 192 is used to determine the alignment of the substrate support 106 relative to the pre-heat ring 105 by taking measurements of the pre-heat ring 105 and substrate support 106 through one of the windows 184. The lid assembly 180, jig 190, and sensor 192 are at least part of an alignment assembly of the process chamber 100.

The motion assembly 121 may be used to adjust the alignment of substrate support 106 relative to the pre-heat ring 105 based on the measurements obtained by the sensor 192. The motion assembly 121 is used to move the substrate support 106 into a desired alignment with the pre-heat ring 105, such as changing the vertical position, lateral position, and/or tilt of the substrate support 106. For example, the motion assembly 121 may be used to center the substrate support 106 within the pre-heat ring 105, such as by bringing the central axis 101 into alignment with the center of the opening of the pre-heat ring 105 as shown in FIG. 1. In one or more embodiments, the controller 120 sends instructions to an operator that allows the operator to manually adjust the alignment of the substrate support 106 using the motion assembly 121. In one or more embodiments, the controller 120 automatically causes the motion assembly 121 to adjust the alignment of the substrate support 106 relative to the pre-heat ring 105 if the controller 120 determines that the substrate support 106 is misaligned based on the information obtained by the sensor 192.

The controller 120 may include a programmable central processing unit (CPU) which is operable with a memory (e.g., non-transitory computer readable medium and/or non-volatile memory) and support circuits. The support circuits are coupled to the CPU and includes cache, clock circuits, input/output subsystems, power supplies, and the like, and combinations thereof coupled to the various components of the process chamber 100, to facilitate control of the process chamber 100. For example, in one or more embodiments the CPU is one of any form of general purpose computer processor used in an industrial setting, such as a programmable logic controller (PLC), for controlling various polishing system components and sub-processors. The memory, coupled to the CPU, is non-transitory and is one or more of readily available memory such as random access memory (RAM), read only memory (ROM), floppy disk drive, hard disk, or any other form of digital storage, local or remote.

Herein, the memory is in the form of a computer-readable storage media containing instructions (e.g., non-volatile memory), that when executed by the CPU, facilitates the operation of the process chamber 100. The instructions in the memory are in the form of a program product such as a program that implements the methods of the present disclosure (e.g., middleware application, equipment software application, etc.). The program code may conform to any one of a number of different programming languages. In one or more embodiments, the disclosure may be implemented as a program product stored on computer-readable storage media for use with a computer system. The program(s) of the program product define functions of the embodiments (including the methods and operations described herein).

Illustrative computer-readable storage media include, but are not limited to: (i) non-writable storage media (e.g., read-only memory devices within a computer such as CD-ROM disks readable by a CD-ROM drive, flash memory, ROM chips or any type of solid-state non-volatile semiconductor memory) on which information is permanently stored; and (ii) writable storage media (e.g., floppy disks within a diskette drive or hard-disk drive or any type of solid-state random-access semiconductor memory) on which alterable information is stored. Such computer-readable storage media, when carrying computer-readable instructions that direct the functions of the methods described herein, are embodiments of the present disclosure.

The various methods (such as the method 900 and/or the method 1000) and operations disclosed herein may generally be implemented under the control of the CPU of the controller 120 by the CPU executing computer instruction code stored in the memory (or in memory of a particular processing chamber) as, e.g., a software routine. When the computer instruction code is executed by the CPU, the CPU controls the components of the process chamber 100 to conduct operations in accordance with the various methods and operations described herein. In one or more embodiments, the memory (a non-transitory computer readable medium) includes instructions stored therein that, when executed, cause the methods (such as the method 900 and/or the method 1000) and operations (such as the operations 902-908 and/or the operations 1003-1015) described herein to be conducted. The operations described herein can be stored in the memory in the form of computer readable logic. The controller 120 can be in communication with the sensor 192 and the motion assembly 121, for example, to cause a plurality of operations to be conducted.

The controller 120 can include one or more machine learning and/or artificial intelligence (ML/AI) algorithms. The one or more ML/AI algorithms can optimize, for example, the adjustment instructions of operation 1015 of the method 1000. The one or more ML/AI algorithms can use, for example, a regression model (such as a linear regression model) or a clustering technique to estimate optimized parameters. The algorithm can be unsupervised or supervised. In one or more embodiments, the controller 120 automatically conducts the operations described herein without the use of one or more ML/AI algorithms. In one or more embodiments, the controller 120 compares measurements (such as data of one or more of operations 1006, 1009, 1010, 1011, and/or 1015) to data in a look-up table and/or a library to determine if the data of the adjustment instructions should be altered. The controller 120 can store measurements as data in the look-up table and/or the library.

The plurality of upper heat sources 141 are disposed between the upper window 108 and the lid assembly 180. The plurality of upper heat sources 141 form a portion of the upper heat source module 155. Upper heat sources 141 provide heat to the substrate 102 and/or the substrate support 106. Upper heat sources 141 can be, for example, tungsten filament heat sources or higher power LEDs. The plurality of upper heat sources 141 can direct radiation, such as infrared radiation, through the upper window 108 to heat the substrate 102 and/or the substrate support 106. The lid assembly 180 may include a plurality of sensors disposed therein for measuring the temperature within the process chamber 100.

The plurality of lower heat sources 143 are disposed between the lower window 110 and a floor 152. The plurality of lower heat sources 143 form a portion of a lower heat source module 145. Lower heat sources 143 can be, for example, tungsten filament heat sources or higher power LEDs. The plurality of lower heat sources 143 can direct radiation, such as infrared radiation, through the lower window 110 to heat the substrate 102 and/or the substrate support 106.

The upper reflector 140 can be attached to the underside of the lid 182. The upper heat sources 141 above the substrate support 106 can be installed underneath the lid 182 within or adjacent to an upper reflector 140. The upper reflector 140 can be formed of a reflective metallic alloy, such as a reflective aluminum alloy. An upper temperature sensor 170, such as a pyrometer, can be installed in, on, or adjacent to the lid assembly 180 to detect a temperature of the substrate 102 during processing.

Lower heat sources 143 can be installed within or adjacent to a lower reflector 130 and within or adjacent to a lower shell assembly 173. The lower reflector 130 can surround the lower shell assembly 173. The lower reflector 130 and/or the lower shell assembly 173 can be formed at least partially (such as partially or entirely) of a reflective metallic alloy, for example a reflective aluminum alloy. A lower temperature sensor 174, such as a pyrometer, can be installed in the lower shell assembly 173 to detect a temperature of the substrate support 106 and/or the back side of the substrate 102.

Although FIG. 1 shows the same size and number of heat sources 141, 143 installed above and below the upper and lower windows, 108, and 110 respectively, different types, intensity, wavelength, numbers, and/or sizes of heat sources may be installed within or adjacent to one or more of the reflectors 130, 140. Additionally, upper heat sources 141 and lower heat sources 143 may be disposed in additional and/or alternative locations.

The flow module 112 includes a plurality of gas inlets 114, a plurality of purge gas inlets 164, and one or more gas exhaust outlets 116. In one or more embodiments, the plurality of gas inlets 114 and the plurality of purge gas inlets 164 are disposed on the opposite side of the flow module 112 from the one or more gas exhaust outlets 116. The upper liner 122 and the lower liners 109 are disposed on an inner surface of the flow module 112 and protect the flow module 112 from reactive gases used during deposition operations and/or cleaning operations. The gas inlet(s) 114 and the purge gas inlet(s) 164 are each positioned to flow a gas parallel to the top surface 150 of a substrate 102 disposed within the process volume 136. The gas inlet(s) 114 are fluidly connected to one or more process gas sources 151 and one or more cleaning gas sources 153. The purge gas inlet(s) 164 are fluidly connected to one or more purge gas sources 162. The one or more gas exhaust outlets 116 are fluidly connected to an exhaust pump 157. One or more process gases supplied using the one or more process gas sources 151 can include one or more reactive gases (such as one or more of silicon (Si), phosphorus (P), and/or germanium (Ge)) and/or one or more carrier gases (such as one or more of nitrogen ($N_2$) and/or hydrogen ($H_2$)). One or more purge gases supplied using the one or more purge gas sources 162 can include one or more inert gases (such as one or more of argon (Ar), helium (He), hydrogen ($H_2$), and/or nitrogen ($N_2$)). One or more cleaning gases supplied using the one or more cleaning gas sources 153 can include one or more of hydrogen (H) and/or chlorine (Cl). In one or more embodiments, the one or more process gases include silicon phosphide (SiP) and/or phospine ($PH_3$), and the one or more cleaning gases include hydrochloric acid (HCl).

The one or more gas exhaust outlets 116 are connected to or include an exhaust system 178. The exhaust system 178 fluidly connects the one or more gas exhaust outlets 116 and the exhaust pump 157. The exhaust system 178 can assist in the controlled deposition of a layer on the substrate 102. In one or more embodiments, the exhaust system 178 is disposed on an opposite side of the process chamber 100 relative to the gas inlet(s) 114 and/or the purge gas inlets 164.

During processing, one or more process gases P1 flow from the gas inlet(s) 114, into the processing volume 136, and over the substrate 102 to form (e.g., epitaxially grow) one or more layers on the substrate 102 while the heat sources 141, 143 heat the pre-heat ring 105 and the substrate 102. After flowing over the substrate 102, the one or more process gases P1 flow out of the internal volume through the one or more gas exhaust outlets 116. The flow module 112 can be at least part of one or more sidewalls of the process chamber 100. The present disclosure contemplates that one or more purge gases can be supplied to the purge volume 138 (through the plurality of purge gas inlets 164) during the deposition operation, and exhausted from the purge volume 138.

Figures 2A, 2B:
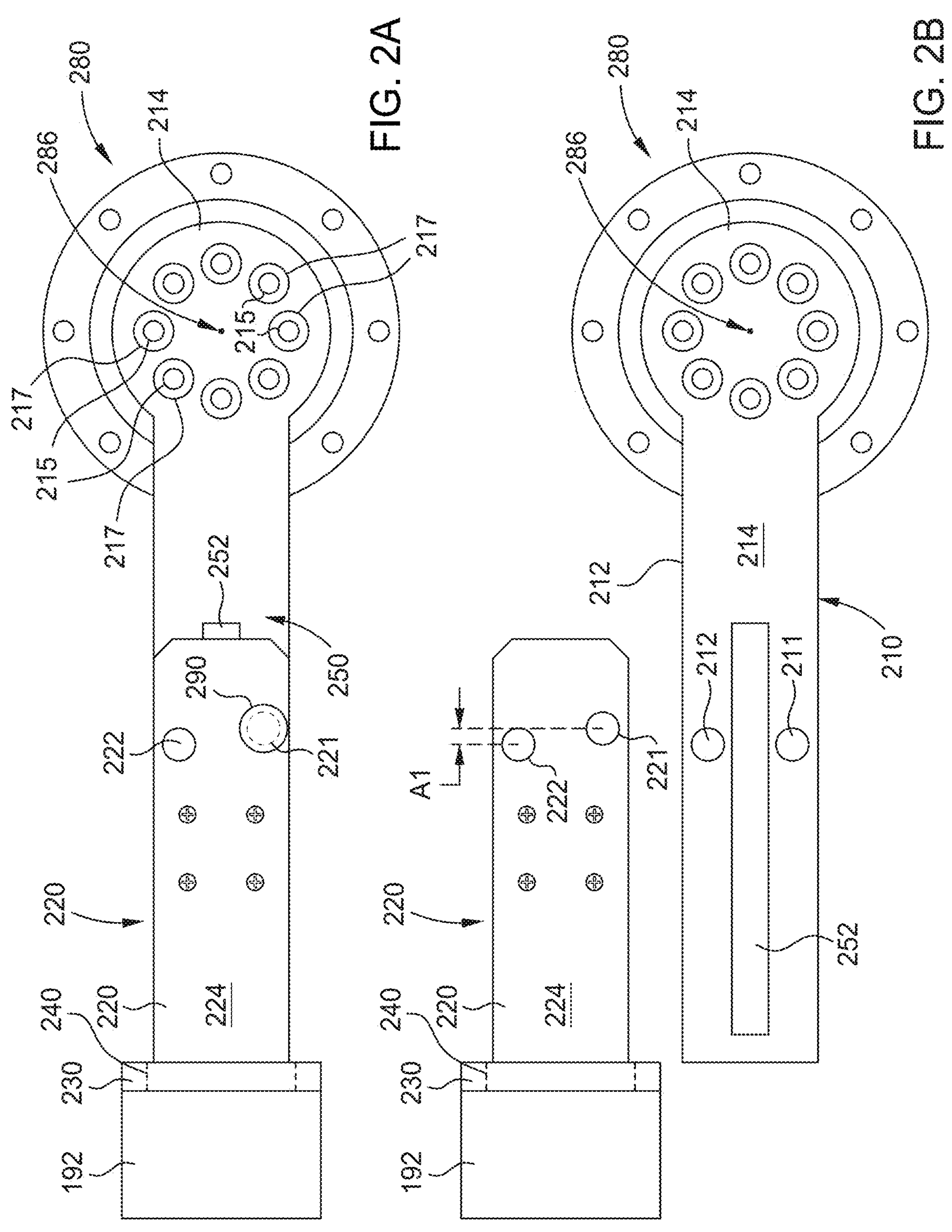
FIG. 2A is a schematic top view of the jig and the sensor shown in FIG. 1, according to one or more embodiments.
FIG. 2B is a schematic top view of the jig of FIG. 2A with an extendable arm separated from a base arm, according to one or more embodiments.

FIG. 2A is a schematic top view of the jig 190 and the sensor 192 shown in FIG. 1, according to one or more embodiments. The jig 190 supports the sensor 192 above one of the windows 184 of the lid assembly 180. The jig 190 includes a base arm 210, an extendable arm 220, a guide rail assembly 250, and a lock pin 290. The guide rail assembly 250 facilitates adjusting the position of the extendable arm 220 relative to the base arm 210 from a retracted position to an extended position. FIG. 2A shows the lock pin 290 inserted through the extendable arm 220 and base arm 210 to lock the extendable arm 220 in the extended position.

FIG. 2B is a schematic top view of the jig 190 shown in FIG. 1 with the extendable arm 220 separated from the base arm 210 to better show features of the base arm 210, according to one or more embodiments. As shown in FIG. 2B, the extendable arm 220 includes a first arm opening 221 and a second arm opening 222 formed in an arm member 224. The centers of the first arm opening 221 and second arm opening 222 are offset from one another by a distance A1 along the longitudinal axis. In other words, the centers of the arm openings 221, 222 are not aligned along the transverse axis that is orthogonal to the longitudinal axis. The extendable arm 220 includes a sensor mount 230 disposed at one end. The sensor mount 230 may be a plate perpendicular to the extendable arm 220, and a tongue of the extendable arm 220 may be fixedly attached within an opening formed within the sensor mount 230. The sensor 192 is attachable to the sensor mount 230. For example, the sensor 192 may be glued to the sensor mount 230 or attached by one or more fasteners (such as one or more screws, bolts, studs, nuts, and/or threaded interfaces). The sensor mount 230 may include one or more openings to allow a wire or cable to be connected to the sensor 192 through the openings in the sensor mount 230. A plurality of fasteners (see FIGS. 2A-2B) may be inserted through fastener openings in the arm member 224 to attach the extendable arm 220 to a carriage 260 of the guide rail assembly 250.

The base arm 210 includes a first base opening 211 and a second base opening 212 extending through the base arm member 214. The base openings 211, 212 are disposed on opposing sides of the rail 252 of the guide rail assembly 250 as shown in FIG. 2B. The base arm 210 is attachable to a rotary joint 280 at a first end 216. As shown, a plurality of fasteners 215 may be disposed in a corresponding openings 217 formed in the first end 216 to attach the base arm 210 to the rotary joint 280. The rotary joint 280 is also attached to the lid assembly 180. In one or more embodiments, the rotary joint 280 includes a body 282 and an attachment member 284. The attachment member 284 may be a flange that can be fastened to the surface of the lid assembly 180 using a plurality of fasteners. The attachment member 284 is partially disposed in a race of the body 282 in engagement with one or more internal bearing elements that allow the body to rotate relative to the attachment member 284 about a pivot point 286. In one or more embodiments, the rotary joint 280 is a turntable bearing. The body 282 is rotatable relative to the attachment member 284, which facilitates rotating the jig 190 about the pivot point 286 to place the sensor 192 above a specific window 184 of the lid assembly 180.

Figure 2C:
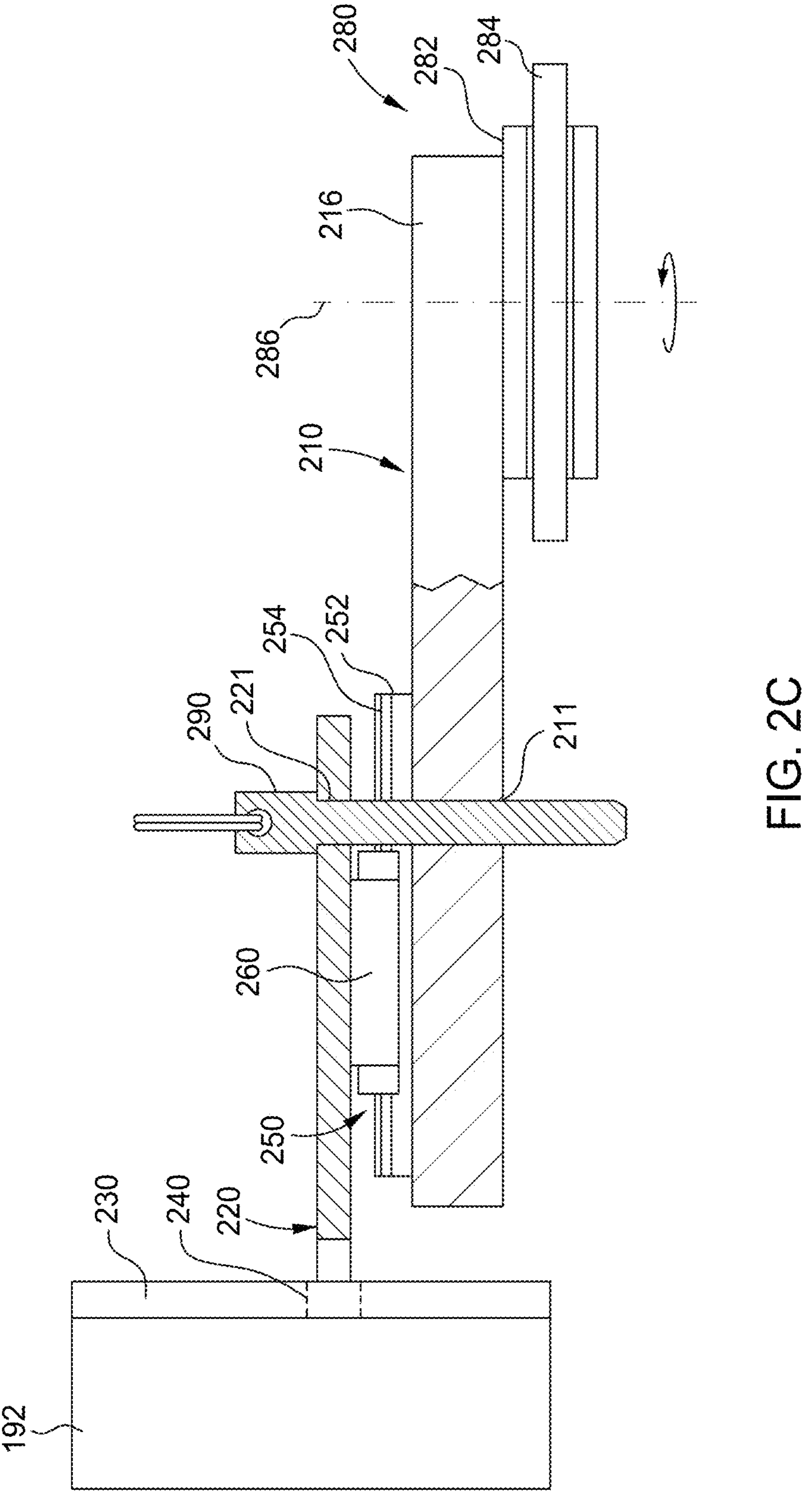
FIG. 2C is a partial schematic cross-sectional view of the jig of FIG. 2A, according to one or more embodiments.
Figure 6:
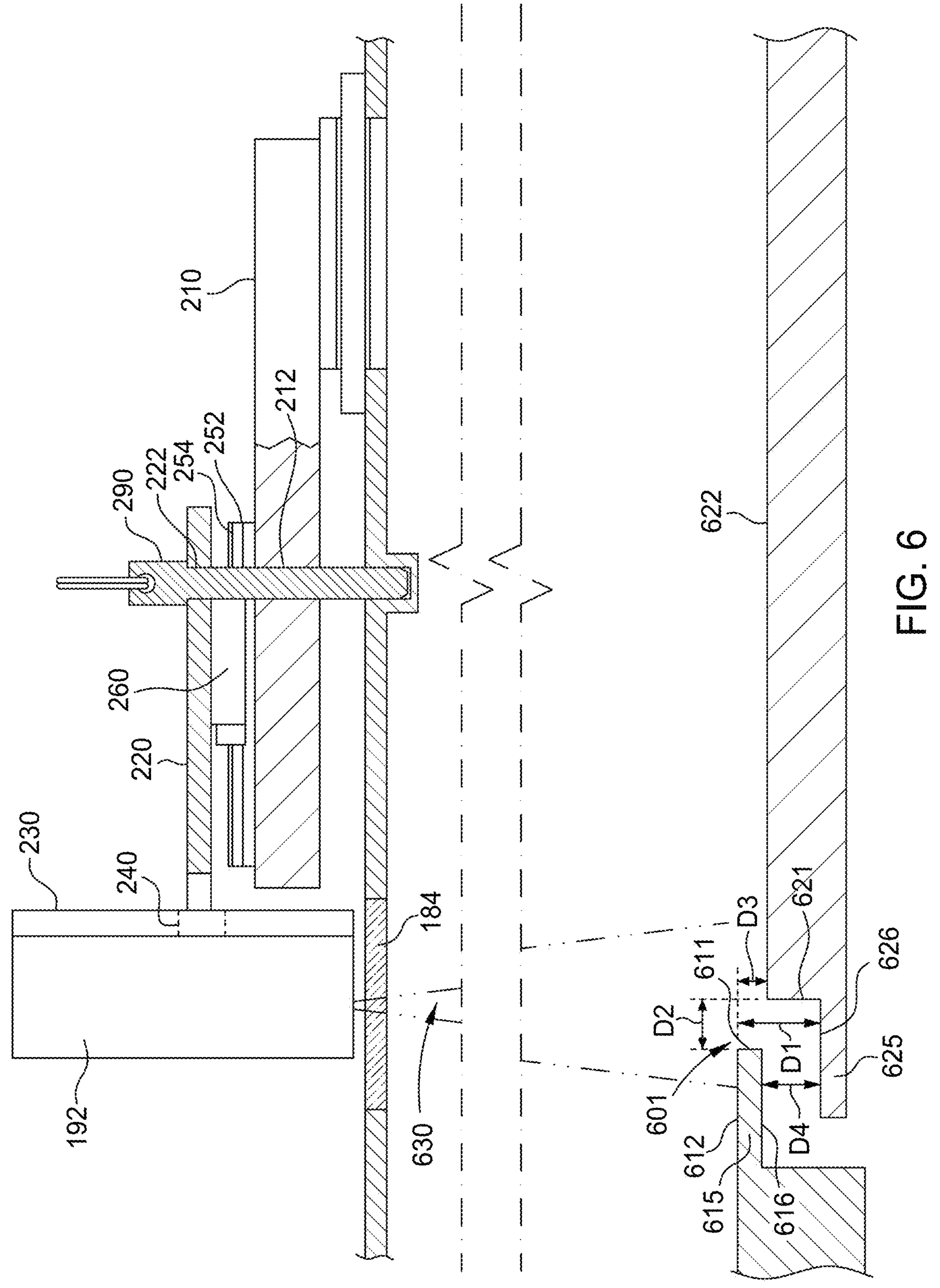
FIG. 6 illustrates a schematic partial cross-sectional side view of the alignment assembly of FIG. 3 above an overlapping substrate support and pre-heat ring, according to embodiments.

FIG. 2C is a partial schematic cross-sectional side view of the jig 190 that shows the guide rail assembly 250, according to one or more embodiments. The guide rail assembly 250 guides the movement of the extendable arm 220 relative to the base arm 210 from the extended position (FIGS. 2A, 2C, 4) to the retracted position (FIG. 6). In one or more embodiments, the guide rail assembly 250 includes at least one rail 252 and a carriage 260. The carriage 260 is slidable along the at least one rail 252 to move the extendable arm 220 between the extended and retracted positions. The carriage 260 may include a plurality of roller elements, such as ball bearings, disposed within and configured to roll along a corresponding race 254 formed on at least one side of the rail 252. The implementation shown in FIGS. 2A-2C includes a single rail 252. In one or more embodiments, the carriage 260 is attached to the extendable arm 220 and the at least one rail 252 is attached to the base arm 210. The carriage 260 may be attached to the base arm 210 while the at least one rail 252 is attached to the extendable arm 220. Additionally, the carriage 260 may be integral with the extendable arm 220 or base arm 210 rather than being a separate component that is attached thereto. In one or more embodiments, the rail 252 is an opening formed in either the base arm 210 or the extendable arm 220 and extending along a length, with the carriage 260 being able to slide within the opening forming the rail 252.

When the extendable arm 220 is in the extended position as shown in FIG. 2C, the first arm opening 221 is disposed over and aligned with the first base opening 211. The lock pin 290 may be inserted into the aligned first base opening 211 and first arm opening 221 to lock the extendable arm 220 in the extended position. When the extendable arm is in the retracted position (see FIG. 6), the second arm opening 222 is disposed over and aligned with the second base opening 212. The lock pin 290 may be inserted into the aligned second arm opening 222 and second base opening 212 to lock the extendable arm in the retracted position.

In one or more embodiments, the extendable arm 220 is locked in a position between the extended and retracted position. For example, the extendable arm 220 may include one or more openings disposed between the first arm opening 221 and second arm opening 222 that can be aligned with at least one of the first and second base openings 211, 212 to accommodate the insertion of the lock pin 290.

The jig 190 is used to support the sensor 192 in a position above the interface between the pre-heat ring 105 and substrate support 106 so that the sensor can scan both the pre-heat ring 105 and substrate support 106 (and any gap between the pre-heat ring 105 and the substrate support 106) to determine an alignment of the pre-heat ring 105 and the substrate support 106 with respect to each other. The jig 190 is used to position the sensor 192 in the correct position above different types (e.g., models) of pre-heat rings 105 and substrate supports 106. The interface may be at a different location depending on the diameter of the inner opening in the pre-heat ring 105 and the dimensions of the substrate support 106. In other words, the interface location may be dependent on the dimension of the model of the pre-heat ring 105 and/or the substrate support 106. The extendable arm 220 is movable to place the sensor 192 above the interface between the pre-heat ring 105 and substrate support 106. In other words, the jig 190 is not limited to being used in conjunction with a particular type or size of pre-heat ring 105 and substrate support 106.

Figure 3:
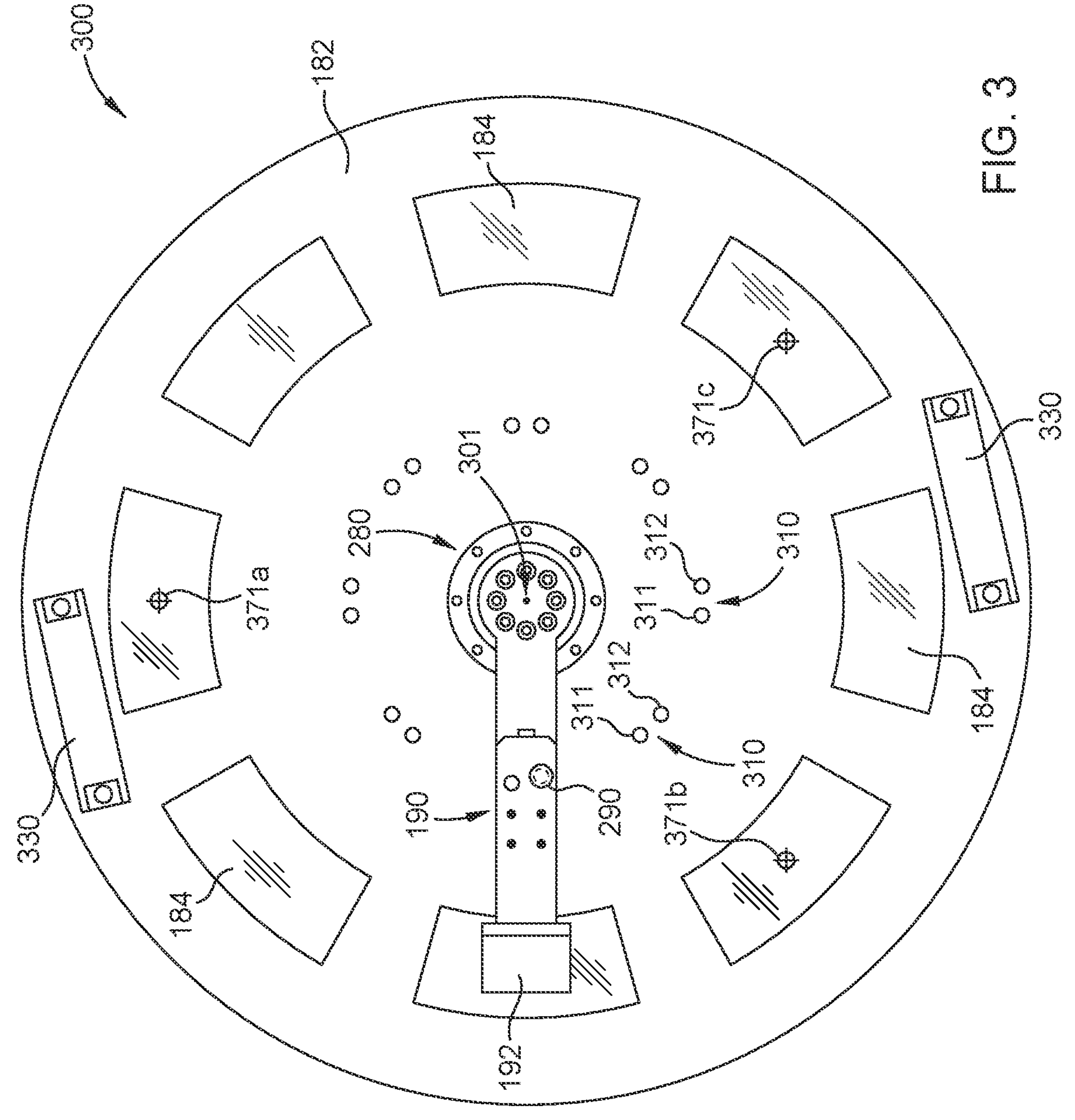
FIG. 3 is a schematic top view of an exemplary alignment assembly 300 used to determine an alignment of a pre-heat ring and substrate support, according to one or more embodiments.

FIG. 3 is a schematic top view of an exemplary alignment assembly 300 used to determine an alignment of the pre-heat ring 105 and substrate support 106, according to one or more embodiments. The alignment assembly 300 includes the lid assembly 180, the jig 190, and the sensor 192. The jig 190 is attached to the lid assembly 180 by the rotary joint 280. The rotary joint 280 facilitates rotating (e.g., pivoting) the jig 190 around a central axis 301 of the alignment assembly 300 to position the sensor 192 above a specific window 184. The central axis 301 coincides with the pivot point 286 of the rotary joint 280. In one or more embodiments, the central axis 301 coincides with the central axis 101 of the substrate support 106 when the substrate support 106 is centered within the pre-heat ring 105. In one or more embodiments, the jig 190 may be moved to two or more windows 184 (e.g., stepping across windows 184) during an operation to determine an alignment of the pre-heat ring 105 and the substrate support 106. The sensor 192 may be an optical, such as laser, sensor configured to direct light (such as light in the red wavelength range) to the pre-heat ring 105 and the substrate support 106 through the windows 184. The sensor 192 collects light reflected off of a surface of the pre-heat ring 105, off of a surface of the substrate support 106, and/or off of a surface aligned below a gap between the pre-heat ring 105 and the substrate support 106. The reflected light is analyzed (e.g., for intensity, such as by using the pixels in an image) to determine a distance between the sensor 192 and the respective surfaces off of which the light is reflected. In one or more embodiments, a higher light intensity indicates a lower distance to the sensor 192.

The lid assembly 180 includes sets of openings 310 configured to receive the lock pin 290 to pivotally lock the jig 190 to the lid assembly 180. The lid assembly 180 may optionally include one or more handles 330 to facilitate lifting and lowering the lid assembly 180. Each set of openings 310 includes a first lock opening 311 and a second lock opening 312. The lock openings 311, 312 are located at the same radial distance from the central axis 301 as the base openings 211, 212. The lock pin 290 is insertable through the aligned first arm opening 221 and first base opening 211 and into the first lock opening 311 when the extendable arm 220 is in the extended position. The lock pin 290 is insertable through the aligned second base opening 212 and second arm opening 222 and into the second lock opening 312 when the extendable arm 220 is in the retracted position. In one or more embodiments, the lock openings 311, 312 may be a bore, a blind bore, a recess, a depression, or other feature in the lid assembly that the lock pin 290 can be inserted into the prevent the jig 190 from pivoting relative to the lid assembly 180.

The sensor 192 is placed and locked in a scan position above a window 184 before scanning the pre-heat ring 105 and substrate support 106 located beneath the window 184. The scan position is based on the location of the interface (e.g., gap) between the substrate support 106 and the pre-heat ring 105. The sensor 192 is in a first scan position when the extendable arm 220 is in the extended position and in a second scan position when the extendable arm 220 is in the retracted position. Once in the scan position, the lock pin 290 is inserted through the jig 190 and into the respective lock opening 311, 312 such that the sensor 192 can be substantially locked in place for scanning operations.

Figure 4:
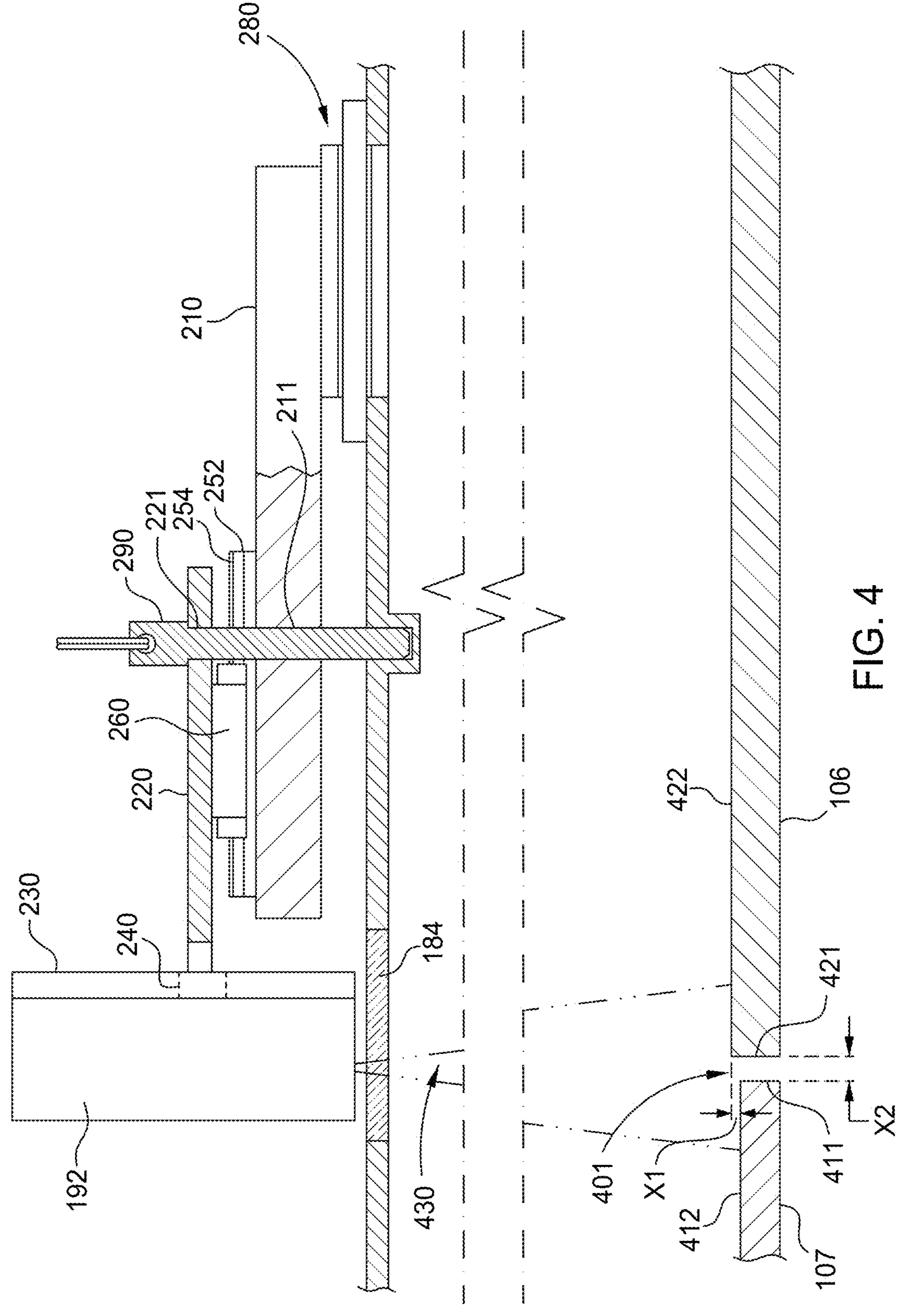
FIG. 4 illustrates a schematic partial cross-sectional side view of the alignment assembly of FIG. 3 above a non-overlapping substrate support and pre-heat ring configuration, according to one or more embodiments.

FIG. 4 is a schematic partial cross-sectional view of the alignment assembly 300 of FIG. 3 above a non-overlapping substrate support 106 and pre-heat ring 105 configuration, according to one or more embodiments. The sensor 192 is shown in the first scan position to scan the non-overlapping substrate support 106 and pre-heat ring 105. The interface between the non-overlapping substrate support 106 and pre-heat ring 105 is a gap 401 located at a first radial distance from the central axis 301 of the alignment assembly 300. The extendable arm 220 is moved to the extended position to place the sensor 192 in the first scan position above the gap 401. The first base opening 211, first arm opening 221, and the first lock opening 311 are shown in alignment with the lock pin 290 inserted therein to lock the extendable arm in the extended position and to pivotally lock the jig 190 to the lid assembly 180.

The sensor 192 is disposed above the gap 401 that is present between an inner edge 411 of the pre-heat ring 105 and an outer edge 421 of the substrate support 106. The pre-heat ring 105 includes a planar upper ring surface 412 and the substrate support 106 includes a planar support surface 422. The substrate 102 is engaged with the support surface 422 during processing with the process chamber 100. The sensor 192 takes a scan 430 of a region of the interior of the process chamber 100 through the window 184. As shown in FIG. 4, the scan 430 includes a portion of the upper ring surface 412, the gap 401, and a portion of the support surface 422.

As shown in FIG. 4, the vertical distance between the upper ring surface 412 to the support surface 422 is shown as a first distance X1, which reflects the vertical alignment of the substrate support 106 and the pre-heat ring 105. The horizontal distance between the opposing inner ring edge 411 and outer edge 421 (e.g., width of the gap 401) is shown as a second distance X2. This second distance X2 reflects the horizontal alignment of the substrate support 106 and pre-heat ring 105. The controller 120 uses the information obtained from the sensor 192 to determine the first distance X1 and/or the second distance X2 to determine an alignment between the substrate support 106 and pre-heat ring 105.

Figure 5:
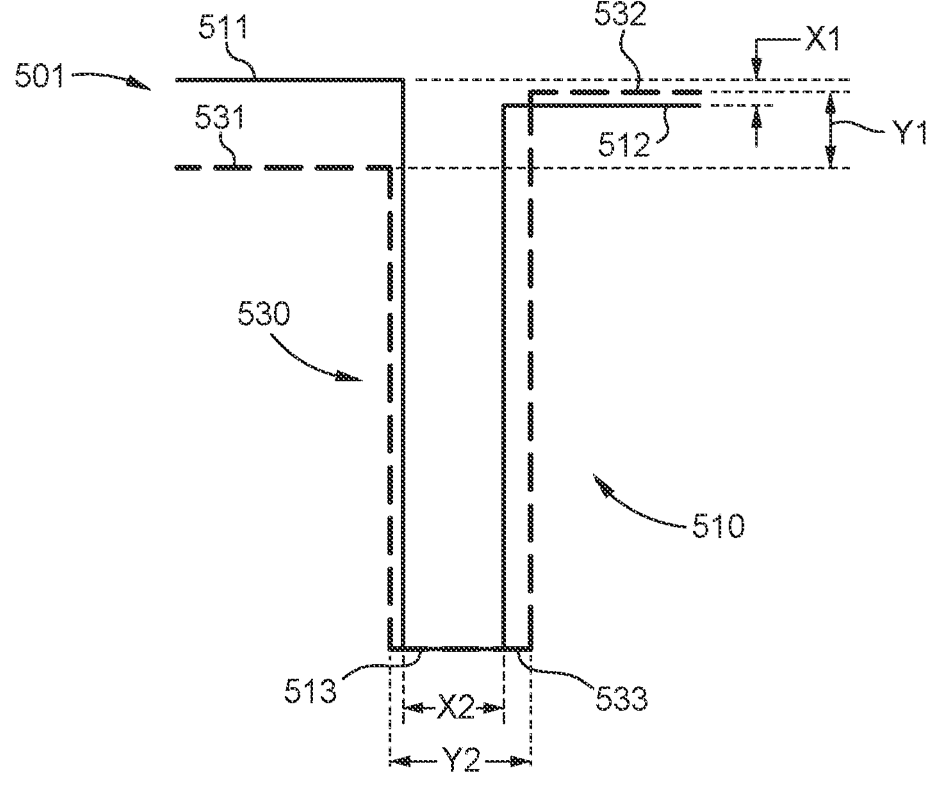
FIG. 5 illustrates a signal obtained by the sensor of the alignment assembly of FIG. 4 compared to a reference profile, according to one or more embodiments.

FIG. 5 illustrates a signal 501 obtained from the sensor 192 of the alignment assembly 300 shown in FIG. 4 compared to a reference profile 530. The signal 501 was produced by scanning the non-overlapping substrate support 106 and pre-heat ring 105 with sensor 192 in the first scan position above the of the non-overlapping substrate support 106 and pre-heat ring 105. The signal 501 represents a distance (e.g., a distance extending along a radial direction extending outwardly relative to a center of the substrate support 106) of the surface(s) being scanned using the sensor 192. In one or more embodiments, the sensor 192 starts scanning the support surface 422 of the substrate support 106 first and scans radially outward (including across the gap 401) until the sensor 192 scans a portion of the upper ring surface 412 of the pre-heat ring 105. In one or more embodiments, the sensor 192 simultaneously scans the support surface 422, the gap 401, and the upper ring surface 412. The signal 501 includes a first profile 510 that includes a first segment 511 separated from a second segment 512 by a third segment 513. The first segment 511 corresponds to the portion of the signal obtained from the scan of the support surface 422 of the substrate support 106. The second segment 512 corresponds to the portion of the signal obtained from the scan of the upper surface of the pre-heat ring 105. The third segment 513 corresponds to the gap 401. The third segment 513 is a drop in the signal 501, and the lower end of the third segment 513 may correspond to a surface of the process chamber 100 disposed beneath the gap 401 that is scanned by the sensor 192. As shown in FIG. 5, the first segment 511 is disposed above the second segment 512. This shows that the support surface 422 is located above, and thus not co-planar with nor below, the upper ring surface 412.

The signal 501 is analyzed for the profile 510. If the profile is not located, such as the signal 501 not including a drop in the signal indicative of the gap 401 (e.g., the signal 501 does not include a segment (such as the third segment 513) within an error range of values), then the controller may display an error message. If the profile is not located in the signal 501, then the sensor 192 is either not in the correct position above the gap 401 or the substrate support 106 and pre-heat ring 105 are in an unacceptable alignment, such as being in contact with one another to close the gap 401. The jig 190 may be adjusted to change the position of the sensor 192 to place the sensor 192 above the interface.

The profile 510 may be analyzed to determine various distances between the substrate support 106 and the pre-heat ring 105. For example, the first distance X1 may be measured by determining the vertical distance between the first segment 511 and the second segment 512. The second distance X2 may be measured by determining the width of the drop (e.g., third segment 513).

After the profile 510 is located, the profile 510 is compared to a generated reference alignment profile 530 which is shown as a dashed line in FIG. 5. The generated reference alignment profile 530 may be stored in the memory of the controller 120. The alignment profile 530 may be generated based on inputting a desired width of the gap 401 and/or a desired offset distance between the support surface 422 of the substrate support 106 and the support surface 422 of the pre-heat ring 105. In one or more embodiments, the alignment profile 530 is generated based on the closest acceptable alignment of the substrate support 106 and pre-heat ring 105 that does not interfere with the process within the process chamber 100. For example, the closest alignment may be the minimum width of the gap 401 that prevents the substrate support 106 from contacting the pre-heat ring 105 as it rotates while processing the substrate 102. Other configurations are contemplates for the closest acceptable alignment.

The reference alignment profile 530 includes a first reference segment 531, a second reference segment 532, and a third reference segment 532. The first reference segment 531 represents a reference position of the support surface 522. The second reference segment 532 represents a reference position of the upper ring surface 412. The vertical distance between the first reference segment 531 and second reference segment 532 are a reference vertical alignment, which is shown as first reference distance Y1. In one or more embodiments, the first reference distance Y1 may be based on the thickness of the substrate 102, such that the top surface 150 of the substrate 102 is co-planar with the upper surface 412 of the pre-heat ring 105. The third reference segment 533 shows a reference width, shown as second reference distance Y2, of the gap 401. The width of the third reference segment 533 is a reference horizontal alignment between the substrate support 106 and the pre-heat ring 105. The lower ends of both the third segment 513 and third reference segment 533 may overlap due to the location of the surface beneath the gap 401.

The controller 120 compares the profile 510 to the reference profile 530 to determine if the substrate support 106 is in an acceptable vertical and horizontal alignment with the pre-heat ring 105. In one or more embodiments, the controller 120 may determine if the upper ring surface 412 and support surface 422 are in an acceptable vertical alignment by determining if measured first distance X1 is within an acceptable variance of first reference distance Y1. For example, the controller 120 may determine that the substrate support 106 and pre-heat ring 105 are in an acceptable vertical alignment if the measured first distance X1 is within a difference of about 10%, such as within about 5%, such as within about 1% of the of the first reference distance Y1. In one or more embodiments, the controller 120 may determine if the substrate support 106 and pre-heat ring 105 are in an acceptable horizontal alignment by determining if the measured second distance X2 is within an acceptable variance of the second reference distance Y1. For example, the controller 120 may determine that the controller 120 are in an acceptable horizontal alignment if the measured second distance X2 is within a difference of about 10%, such as within about 5%, such as within about 1% of the of the second reference distance Y2.

If the controller 120 determines that the substrate support 106 and pre-heat ring 105 are not in an acceptable alignment (e.g., misaligned), then the controller issues instructions to either the operator or to the motion assembly 121 to adjust the alignment. For example, the controller 120 may determine the distance between the first segment 511 is outside of an acceptable range with the first reference segment 531. The controller 120 may then cause the motion assembly 121 to raise or lower the substrate support 106 to place the substrate support 106 in the desired vertical alignment with the pre-heat ring 105. Similarly, the controller 120 may measure the differential in the widths of the third segment 513 and third reference segment 533 and cause the motion assembly 121 to move the substrate support (e.g., a pedestal and/or one or more ring segments (such as a complete ring)) laterally to bring the substrate support 106 into a desired horizontal alignment with the pre-heat ring 105. In one or more embodiments, the controller 120 may issue instructions to the operator on how to manually use the motion assembly 121 to bring the substrate support into the desired alignment. For example, the controller 120 may instruct the operator to rotate a dial of the motion assembly 121 a number of revolutions to adjust the alignment of the substrate support 106.

In one or more embodiments, the alignment of the substrate support 106 to the pre-heat ring 105 is determined by taking a single scan with the sensor 192 through a single window 184. In one or more embodiments, the multiple scans are taken at different locations (such as the three locations 371*a*-371*c* shown in FIG. 3 above different windows 184) of the interface between the substrate support 106 and the pre-heat ring 105. In order to take multiple scans, the jig 190 is placed in a first position such that the sensor 192 is disposed over a first window 184 by pivoting the jig 190 about the rotary union 280. The base openings 211, 212 are disposed above the corresponding lock opening 311, 312 when the jig 190 is in the first position. The position of the sensor 192 above the first window 184 may be adjusted to position the sensor 192 above the interface of the pre-heat ring 105 and the substrate support 106. The lock pin 290 is then inserted through the jig 190 and into a lock opening 311, 312 to lock the extendable arm 220 in a position and to lock the jig 190 in the first position. After the scan is complete, the lock pin 290 is at least withdrawn from the corresponding lock opening 311, 312. The jig 190 is pivoted about the rotary union 280 to place the sensor 192 above a second window. The extendable arm 220 may then be positioned to place the sensor 192 above the interface. In one or more embodiments, the lock pin 290 is not fully removed from the jig 190 which keeps the extendable arm 220 locked in a position while the jig 190 is pivoted to a different position. The sensor 192 may be moved to two or more, such as three or more, windows in this manner to position the sensor 192 above a different part of the interface between the substrate support 106 and the pre-heat ring 105.

FIG. 6 is a schematic partial cross-sectional side view of the alignment assembly 300 of FIG. 3 above an overlapping substrate support 106 and pre-heat ring 105 configuration, according to one or more embodiments. The sensor 192 is shown in the second scan position to scan the overlapping substrate support 106 and pre-heat ring 105. The interface, shown as a gap 601, between the overlapping substrate support 106 and pre-heat ring 105 is located at a second radial distance from the central axis 301 of the alignment assembly 300 that is less than the first radial distance shown in in FIG. 4. The extendable arm 220 is moved to the retracted position to place the sensor 192 in the second scan position above the gap 601. The second base opening 212, the second arm opening 222, and the second lock opening 312 are shown in alignment with the lock pin 290 inserted therein to lock the extendable arm in the retracted position and to pivotally lock the jig 190 to the lid assembly 180.

As shown in FIG. 6, the pre-heat ring 105 includes a planar upper ring surface 612 that partially extends along a ring shoulder 615. The ring shoulder 615 includes an inner ring edge 611 that extends to a planar ring shoulder surface 616 disposed beneath the upper ring surface 612. The substrate support 106 includes a planar support surface 622 (e.g., upper surface). A support shoulder 625 extends from the substrate support 106 that overlaps with the ring shoulder 615. An edge surface 621 extends from the support surface 612 to a planar support shoulder surface 626 of the support shoulder 625. The gap 601 separates the opposing inner ring edge 611 and edge surface 621 and the opposing ring shoulder surface 616 and support shoulder surface 626.

The sensor 192 is disposed above the gap 601. The sensor 192 takes a scan 630 of a region of the interior of the process chamber 100 through the window 184. A shown in FIG. 6, the scan 630 includes a portion of the upper ring surface 612, a portion of the support shoulder surface 626 at the bottom of the gap 601, and a portion of the support surface 622.

As shown in FIG. 6, the vertical distance between the upper ring surface 612 to the support shoulder surface 626 is shown as first distance D1. The horizontal distance between the opposing inner ring edge 611 and edge surface 621 (e.g., width of the gap 601) is shown as second distance D2. This second distance D2 reflects the horizontal alignment of the substrate support 106 and pre-heat ring 105. The vertical distance between the upper ring surface 612 and the support surface 622 is shown as third distance D3, which reflects the vertical alignment of the substrate support 106 and the pre-heat ring 105. The vertical distance between the ring shoulder surface 616 and support shoulder surface 626 is shown as distance D4. The controller 120 uses the information obtained from the sensor 192 to determine the first distance D1, second distance D2, third distance D3, and fourth distance D4, and uses these distances to determine one or more alignments (such as a vertical alignment and/or a horizontal alignment) between the substrate support 106 and pre-heat ring 105.

Figure 7:
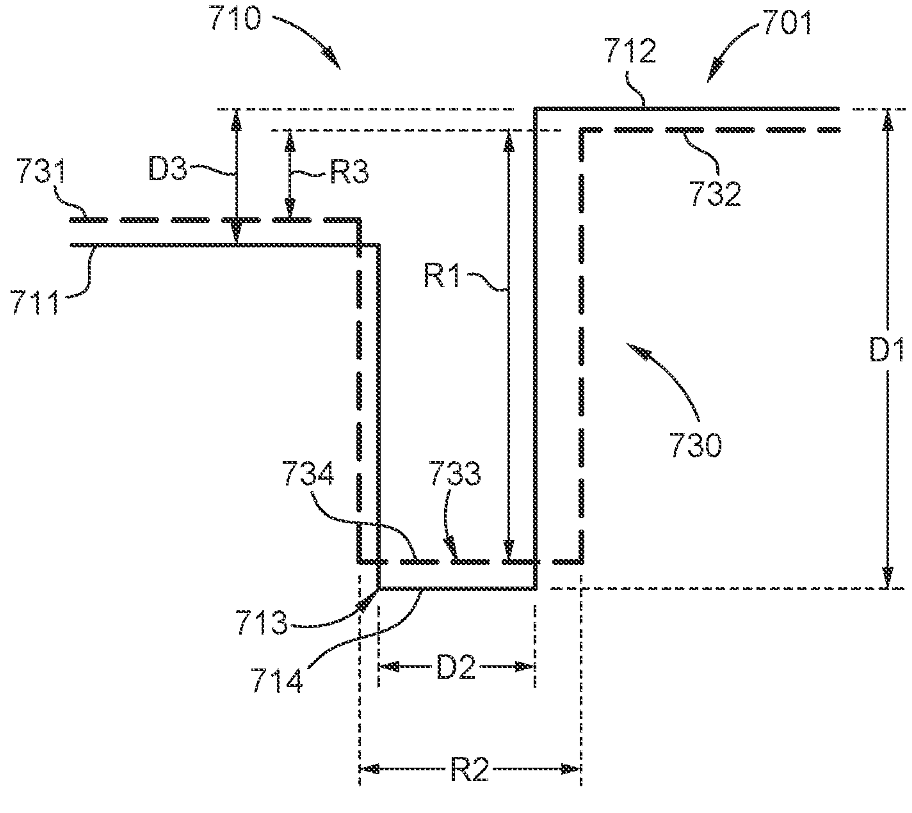
FIG. 7 illustrates a signal obtained by the sensor of the alignment assembly of FIG. 6 compared to a reference profile, according to one or more embodiments.

FIG. 7 illustrates a signal 701 obtained from the sensor 192 of the alignment assembly 300 shown in FIG. 6 compared to a reference profile 730. The signal 701 was produced by scanning the overlapping substrate support 106 and pre-heat ring 105 with the sensor 192 in the second scan position above of the overlapping substrate support 106 and pre-heat ring 105. The signal 701 represents the distance of the surface being scanned from the sensor 192. In one or more embodiments, the sensor 192 starts scanning the support surface 622 of the substrate support 106 first and scans radially outward until it scans a portion of the upper ring surface 612 of the pre-heat ring 105. In one or more embodiments, the sensor 192 simultaneously scans the support surface 622, the gap 601, and the upper ring surface 612. The signal 701 includes a profile 710 that includes a first segment 711 separated from a second segment 712 by a third segment 713. The first segment 711 corresponds to the portion of the signal obtained from the scan of the support surface 622 of the substrate support 106. The second segment 712 corresponds to the portion of the signal obtained from the scan of the upper ring surface 612 of the pre-heat ring 105. The third segment 713 corresponds to the gap 601, with the bottom of the drop in the signal corresponding to the distance of the support shoulder surface 626 from the sensor 192. As shown in FIG. 7, the first segment 711 is disposed below the second segment 712, which shows that the support surface 622 is located below, and thus not co-planar with, the upper ring surface 612.

The signal 701 is analyzed for the profile 710. If the profile 710 is not located, such as the signal 701 not including a drop in the signal indicative of the gap 601, then the controller may display an error message. If the profile is not located in the signal 701, then the sensor 192 is either not in the correct position above the gap 601 or the substrate support 106 and pre-heat ring 105 are in an unacceptable alignment, such as being in contact with one another to close the gap 401. The jig 190 may be adjusted to change the position of the sensor 192 to place the sensor 192 above the interface in an acceptable manner.

The profile 710 may be analyzed to determine various distances between the substrate support 106 and the pre-heat ring 105. For example, the first distance D1 may be measured by determining the vertical distance between the second segment 712 and the bottom of the third segment 713 as shown in FIG. 7. The second distance D2 may be measured by determining the width of the drop (e.g., third segment 713), such as determining the length of the bottom 714 of the third segment 713. The third distance D3 may be measured by determining the vertical distance between the first segment 711 and second segment 712. The present disclosure also contemplates that the distance D3 may be determined by subtracting the known (e.g., fixed) vertical distance of edge surface 621 from distance D1. The fourth distance D4, the distance between the opposing ring shoulder surface 616 and support shoulder surface 626, may be determined by subtracting the known (e.g., fixed) vertical dimension of the inner ring edge 611 from distance D1.

After the profile 710 is generated (e.g., located and/or displayed), the profile 710 is compared to a generated reference alignment profile 730 which is shown as a dashed line in FIG. 7. This generated reference alignment profile 730 may be stored in the memory of the controller 120. The reference alignment profile 730 includes a first reference segment 731, a second reference segment 732, and a third reference segment 733. The first reference segment 731 represents a reference position of the support surface 622. The second reference segment 732 represents a reference position of the upper ring surface 612. The vertical distance between the first reference segment 731 and the bottom 734 of the third reference segment 733 is a first reference distance R1, which is a reference distance between the upper ring surface 622 and the substrate shoulder surface 626. The third reference segment 733 shows a reference width, shown as second reference distance R2, of the gap 601. The width of the third reference segment 733 is a reference horizontal alignment between the substrate support 106 and the pre-heat ring 105. The vertical distance between the first reference segment 731 and second reference segment 732 are a reference vertical alignment, which is shown as third reference distance R3. This third reference distance R3 may be based on the thickness of the substrate 102, such that the top surface 150 of the substrate 102 is co-planar with the upper ring surface 612 of the pre-heat ring 105.

In one or more embodiments, the alignment profile 730 is generated based on a desired alignment of the substrate support 106 and pre-heat ring 105 during processing. The alignment profile 730 may be generated based on inputting a desired vertical distance between the upper ring surface 612 of the pre-heat ring 105 and the shoulder support surface 626 of the substrate support 106 into the controller 120 shown as first reference distance R1. Additionally, the alignment profile may be generated by inputting the desired distance between the opposing inner ring edge 611 and edge surface 621 (e.g., width of gap 601).

The controller 120 compares the profile 710 to the reference profile 730 to determine if the substrate support 106 is in an acceptable vertical and/or horizontal alignment with the pre-heat ring 105. In one or more embodiments, the controller 120 may determine if the upper ring surface 612 and support surface 622 are in an acceptable vertical alignment by determining if measured third distance D3 is within an acceptable variance of third reference distance R3. For example, the controller 120 may determine that the substrate support 106 and pre-heat ring 105 are in an acceptable vertical alignment if the measured third distance D3 is within a difference of about 10%, such as within about 5%, such as within about 1% of the of the third reference distance R3. In one or more embodiments, the controller 120 may determine if the substrate support 106 and pre-heat ring 105 are in an acceptable horizontal alignment by determining if the measured second distance D2 is within an acceptable variance of the second reference distance D1. For example, the controller 120 may determine if the substrate support 106 and pre-heat ring 105 are in an acceptable horizontal alignment if the measured second distance D2 is within a difference of about 10%, such as within about 5%, such as within about 1% of the of the second reference distance R2.

In one or more embodiments, the reference vertical alignment is the vertical distance (e.g., height) between the second reference segment 732 and the third segment 733. In other words, the first reference distance R1 is the height of the drop between the second reference segment 732 and the third segment 733. In one or more embodiments, the controller 120 may determine if the upper ring surface 612 and support surface 622 are in an acceptable vertical alignment by determining if the measured first measured distance D1 is within an acceptable variance of first reference distance R1. For example, the controller 120 may determine the pre-heat ring 105 and substrate support 106 are in an acceptable vertical alignment if the measured third distance D1 is within a difference of about 10%, such as within about 5%, such as within about 1% of the of the first reference distance R1.

If the controller 120 determines that the substrate support 106 and pre-heat ring 105 are not in an acceptable alignment (e.g., are misaligned), then the controller issues instructions to either the operator or to the motion assembly 121 to adjust the alignment. For example, the controller 120 may determine the distance between the first segment 711 is outside of an acceptable range relative to the first reference segment 731. The controller 120 may then cause the motion assembly 121 to raise or lower the substrate support 106 to place the substrate support 106 in the desired vertical alignment with the pre-heat ring 105. Similarly, the controller 120 may measure the differential in the widths of the third segment 713 and third reference segment 733 and cause the motion assembly 121 to move the substrate support laterally to bring the substrate support 106 into a desired horizontal alignment with the pre-heat ring 105. In one or more embodiments, the controller 120 may issue instructions to the operator on how to manually use the motion assembly 121 to bring the substrate support into the desired alignment. For example, the controller 120 may instruct the operator to rotate a dial of the motion assembly 121 a number of revolutions to adjust the alignment of the substrate support 106.

In one or more embodiments, the alignment profile 730 is generated based on the closest alignment of the substrate support 106 and pre-heat ring 105 that does not interfere with the process within the process chamber 100. The alignment profile 730 may be generated based on inputting a the minimum acceptable vertical distance between the upper ring surface 612 of the pre-heat ring 105 and the shoulder support surface 626 of the substrate support 106 into the controller 120. This minimum vertical distance may be based on the closest allowable distance between the opposing ring shoulder surface 616 and shoulder support surface 626 to prevent them from contacting one another during processing. Additionally, the alignment profile may be generated based on the minimum allowable distance between the opposing inner ring edge 611 and edge surface 621 to prevent them from contacting one another during processing.

If the alignment profile 730 is based on a closest alignment of the substrate support 106 and pre-heat ring 105, then the reference profile 730 is a threshold. In other words, the controller 120 is evaluating whether or not the profile 710 exceeds the reference profile 730. The controller 120 determines that the substrate support 106 and pre-heat ring 105 are in an unacceptable alignment if the profile exceeds the reference profile 730. For example, the alignment can be unacceptable if the first segment 711 exceeds (e.g., is disposed above) the first reference segment 731. The alignment can also be unacceptable if the second segment 712 exceeds e.g., is disposed above) the second reference segment 712. Additionally, the alignment can be unacceptable if the third segment 713 has a width less than the third reference segment 733. If the controller 120 determines that the substrate support 106 and pre-heat ring 105 are misaligned, then the controller issues instructions to either the operator or to the motion assembly 121 to adjust the alignment. For example, the controller 120 may measure how far the first segment 711 is above the first reference segment 731 and instruct the motion assembly 121 to lower the substrate support 106 relative to the pre-heat ring by at least such a distance. Similarly, the controller 120 may instruct the motion assembly 121 to adjust the lateral position of the substrate support 106 by at least a differential in the distance in the width of the third profile segment 713 relative to the third reference segment 733. If the profile 710 exactly matches the reference profile 730, then the substrate support 106 and pre-heat ring 105 are in the closest acceptable alignment. The controller 120 may instruct the operator to adjust the alignment to increase the distance between the substrate support 106 and the pre-heat ring 105.

In one or more embodiments, the alignment of the substrate support 106 to the pre-heat ring 105 is determined by taking a single scan with the sensor 192 through a single window 184. In one or more embodiments, the multiple scans are taken at different locations of the interface between the substrate support 106 and the pre-heat ring 105 (and at different windows 184). In order to take multiple scans, the jig 190 is placed in a first position such that the sensor 192 is disposed over a first window 184 by pivoting the jig 190 about the rotary union 280. The base openings 211, 212 are disposed above the corresponding lock opening 311, 312 when the jig 190 is in the first position. The position of the sensor 192 above the first window 184 may be adjusted to position the sensor 192 above the interface of the pre-heat ring 105 and the substrate support 106. The lock pin 290 is then inserted through the jig 190 and into a lock opening 311, 312 to lock the extendable arm 220 in a position and to lock the jig 190 in the first position. After the scan is complete, the lock pin 290 is at least withdrawn from the corresponding lock opening 311, 312. The jig 190 is pivoted about the rotary union 280 to place the sensor 192 above a second window. The extendable arm 220 may then be positioned to place the sensor 192 above the interface. In one or more embodiments, the lock pin 290 is not fully removed from the jig 190 which keeps the extendable arm 220 locked in a position while the jig 190 is pivoted to a different position. The sensor 192 may be moved to two or more, such as three or more, windows in this manner to position the sensor 192 above a different part of the interface between the substrate support 106 and the pre-heat ring 105.

For example, the extendable arm 220 may be moved to the extended position to place the sensor 192 above the interface below the first window 184 as shown in FIG. 3, with the sensor 192 being over the bottom most window 184. The lock pin 290 is then inserted through aligned first base opening 211, first arm opening 222, and first lock opening 311 to lock the extendable arm 220 in the extended position and to lock the jig 190 in the first position. The sensor 192 then scans the internal region of the process chamber 100 below it through the window 184 to scan the interface between the substrate support 106 and the pre-heat ring 105. After the scan through the first window 184 is complete, then lock pin 290 is then at least withdrawn from the first lock opening 311 to allow the jig 190 to be pivoted to a second position to place the sensor 192 above a second window 184. The jig 190 may be pivoted a number of degrees, such as by about 90 degrees, about 120 degrees, or about 135 degrees in a clockwise manner from the position shown in FIG. 3 to place the sensor 192 above a different window 184. For example, jig 190 may be pivoted about 90 degrees from the position shown in FIG. 3 to location 371*a* to place the sensor above the window 184 adjacent to the left handle 330. The lock pin 290 is then inserted to lock the jig 190 in the second position and to lock the jig 190 in the extended position. The sensor 192 then scans the internal region of the process chamber 100 below it through the second window 184 to scan the interface between the substrate support 106 and the pre-heat ring 105. After the through the second window 184 scan is complete, then lock pin 290 is then at least withdrawn from the first lock opening 311 to allow the jig 190 to be pivoted to a third position to place the sensor 192 above a third window 184. For example, the jig 190 may be pivoted by about 135 degrees in a clockwise manner to place the sensor 192 at location 371*c* above the window 184 to the right of the top most window shown in FIG. 3. The lock pin 290 is then inserted to lock the jig 190 in the third position and to lock the jig 190 in the extended position. The sensor 192 then scans the internal region of the process chamber 100 below it through the third window 184 to scan the interface between the substrate support 106 and the pre-heat ring 105. The sensor 192 may be positioned over additional windows in a similar manner (such as using pivoting by about 90 degrees to location 371*b*). Additionally, the jig 190 may be moved to one or more positions in the retracted position in a similar manner as described in this paragraph, with the lock pin 290 being inserted through the aligned second base opening 212, second arm opening 222, and second lock opening 332.

The multiple scans taken by the sensor 192 may be used to determine the alignment of the substrate support 106 and pre-heat ring 105 in three different dimensions. For example, the information gathered at each scan may be analyzed to determine if the substrate support 106 is tilted at an unacceptable angle relative to the pre-heat ring 105. Additionally, the multiple scans may be analyzed to determine if the substrate support 106 is off-center in both the X and Y axial directions. The controller 120 may use the multiple scans to issue instructions to adjust the alignment of the substrate support 106, such as issuing instructions to an operator or causing the motion assembly 121 to automatically adjust the alignment.

Figure 8:
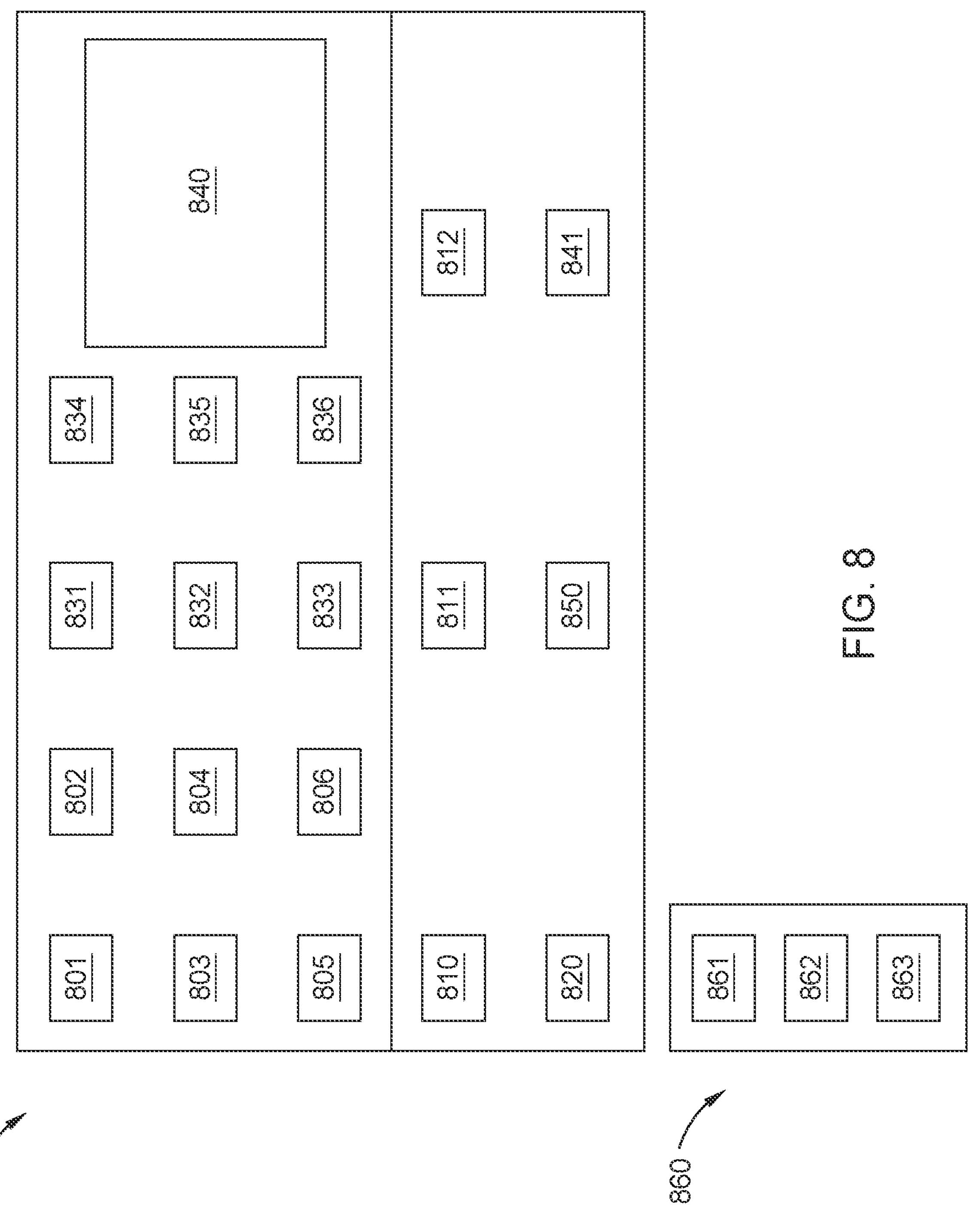
FIG. 8 illustrates a schematic view of a user interface of a controller according to one or more embodiments.

FIG. 8 illustrates a schematic view of a user interface 800 of the controller 120 that may be accessed by a customer operator, according to one or more embodiments. The user interface 800 may be displayed on a screen, or on a touch screen, connected to the process chamber 100 or located remotely from the process chamber 100. By way of example, the user interface 800 corresponds to an overlapping substrate support 106 and pre-heat ring 105 shown in FIG. 6. The distance between the upper ring surface 612 of the pre-heat ring 105 and the substrate shoulder surface 626 (e.g., first distance D1) measured by the sensor 192 above a first window 184 is displayed at box 801. Box 802 displays the distance between the inner ring edge 611 and edge surface 621 (e.g., second distance D2) measured by the sensor 192 through the first window 184. The first distance D1 and second distance D2 taken by the sensor 192 above a second window 184 are displayed as boxes 803, 804, respectively. The first distance D1 and second distance D2 taken by the sensor 192 above a third window 184 are displayed as boxes 805, 806, respectively.

The operator may select (e.g., select using a mouse or push, such as tap on a touch screen) a first button 810 to take the measurements displayed at boxes 801, 802 after the sensor 192 is locked in the first position above the first window 184. A second button 811 may be selected to take the measurements displayed at boxes 803, 804 after the sensor 192 is locked in position above the second window 184, and a third button 812 may be selected to take the measurements displayed at boxes 805, 806 after the sensor 192 is locked in position above the third window 184. The buttons 810, 811, 813 may be buttons on a touch screen.

Box 831 represents the display of the level (e.g., tilt) of the support surface 622 located below the first window 184. Boxes 832, 833 represent the display the level of the support surface 622 beneath the second and third windows 184, respectively. The boxes 831, 832, and 833, may display the amount the support surface 622 differs from being at a level alignment with the upper ring surface 612 of the pre-heat ring 105. The level may be calculated using the differences in the first distance D1 or third distance D3 at each measured region of the interface, which may be used to determine the angle at which the substrate support 106 is tilted. Box 834 represents on the display the distance that the center of the substrate support 106 is from being centered within the pre-heat ring 105. In other words, box 834 represents the center offset of the substrate support 106 beneath the first window. The center offset may be calculated by subtracting measured D2 from the second reference distance R2, with the second distance R2 being the width of the gap 601 that would be present if the substrate support 106 was centrally aligned within the pre-heat ring 105. Box 835, 836 represents the center offset beneath the second and third windows 184, respectively. In one or more embodiments, the values of boxes 801, 803, 805 indicate the values of the first distance D1 at each of the three positions under the three respective windows 184. In one or more embodiments, the values of boxes 802, 804, 806 indicate the values of the third distance D3 at each of the three positions under the three respective windows 184. In one or more embodiments, the values of boxes 831, 832, 833 indicate the values of the fourth distance D4 at each of the three positions under the three respective windows 184. In one or more embodiments, the values of boxes 834, 835, 836 indicate the values of the second distance D2 at each of the three positions under the three respective windows 184. In one or more embodiments, the display shows each of the first distance D1, the second distance D2, the third distance D3, and the fourth distance D4 for each of the three positions under the three respective windows 184.

The operator may select a calculate button 820 to calculate the level and center offset values, which are then displayed to the operator. In one or more embodiments, the operator waits until the sensor 192 takes measurements through all three windows prior to calculating the level and center offset values. In one or more embodiments, the operator can press the calculate button 820 after each scan to display the level values and offset values.

In one or more embodiments, the user interface 800 includes a panel 840 that may display if the substrate support 106 is in an acceptable alignment. If the controller 120 determines that an acceptable alignment is present, then the user may then engage button 841 to accept the alignment. If the controller 120 determines that the alignment is unacceptable, the panel 840 may display instructions on how to adjust the alignment to bring the substrate support 106 into an acceptable alignment. If the alignment is manually adjusted, the operator may engage button 841 to accept the alignment after the manual adjustment is complete. In one or more embodiments, the panel 840 may show that the aliment is unacceptable, and the user may engage button 841 to cause the motion assembly 121 to bring the substrate support 106 into an acceptable alignment. In one or more embodiments, the user interface 800 also includes a reset button 850, which may be used to reset the user interface 800.

In one or more embodiments, a user interface may be displayed on the display (before, during, and/or after the display of the user interface 800) that allows a user to input reference data for each of the distances D1-D4. The reference data inputted into the user interface can be used to generate, for example one of the reference profiles described herein.

FIG. 8 shows a second user interface 860 used to generate the reference signal. The second user interface 860 can be displayed on the display before, during, and/or after the user interface 800 is displayed on the display. Box 861 shows the current first reference distance R1. This first reference distance R1 may be changed by inputting a new distance into input 862. Engaging button 863 generates a reference profile based on the new reference distance R1 input into input 862. The second user interface 860 may also similarly include an input for second reference distance reference R2, and the reference profile may be generated based on the first and second reference distances R1 and R2. The second user interface 860 may be locked from the customer operator. In other words, manufacturing personnel may input the reference distance R1 based on the model of substrate support 106 and pre-heat ring 105 used in the process chamber 100.

Figures 9, 10:
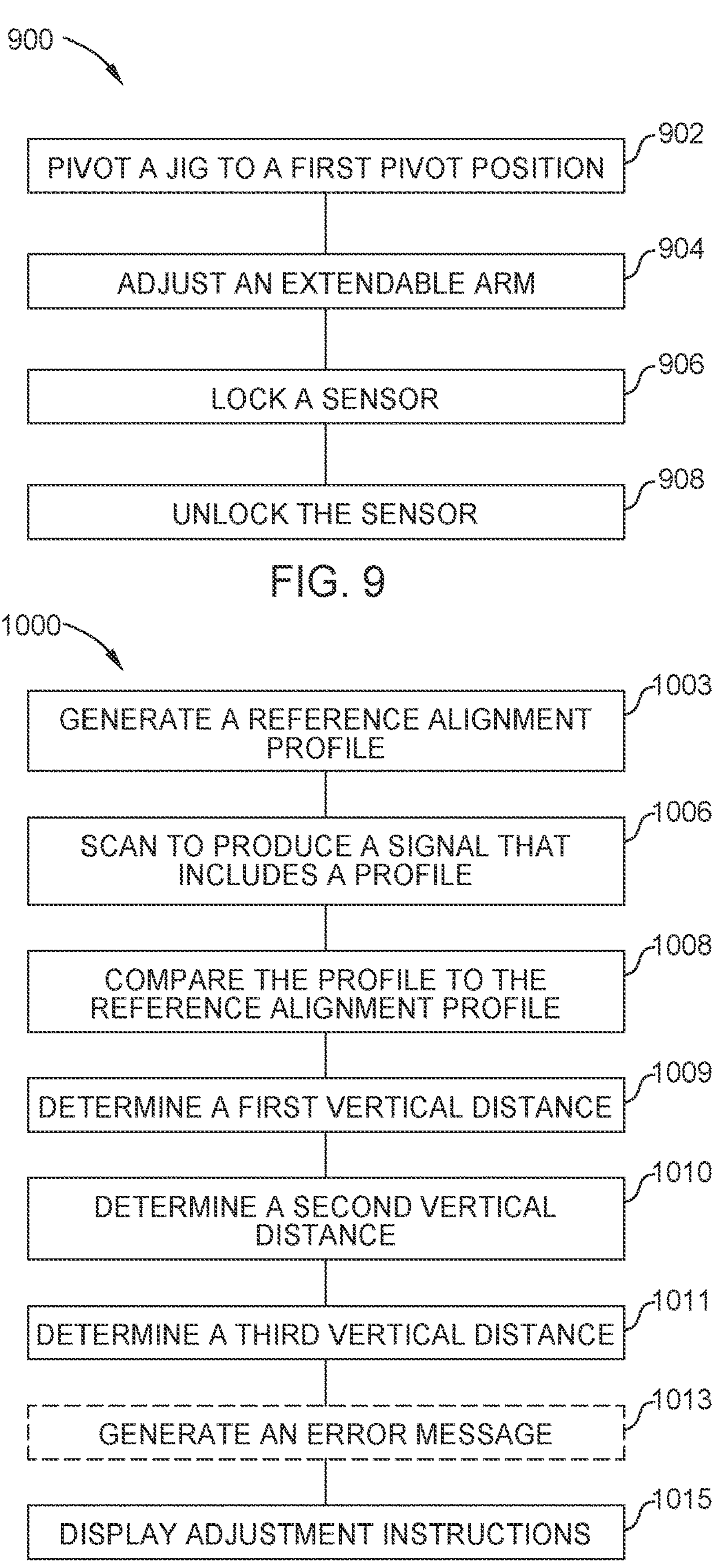
FIG. 9 is a flowchart of a method of positioning a sensor according to one or more embodiments.
FIG. 10 illustrates a flow chart of an exemplary method of determining an alignment within a process chamber, according to one or more embodiments.

FIG. 9 illustrates a flow chart of an exemplary method 900 of positioning a sensor 192, according to one or more embodiments.

At operation 902, a jig 190 mounted to a lid 182 of a process chamber 100 is pivoted to a first pivot position to place the sensor 192 connected to an extendable arm 220 of the jig 190 above a first window 184 of the lid 182.

At operation 904, the position of the extendable arm 220 relative to the base arm 210 of the jig 190 is adjusted to dispose the sensor at a first position above the first window 184.

At operation 906, the sensor 192 is locked in the first position above the first window 184 by inserting the lock pin 290 through the extendable arm 220, the base arm 210, and into a first lock opening 311 formed in the lid 182. The sensor 192 may then scan a surface of a pre-heat ring 105, a surface of a substrate support 106, and a gap between the pre-heat ring 105 and the substrate support 106 with the sensor 192 locked in the first position.

At operation 908, the sensor is unlocked from the first position by withdrawing the lock pin 290 and pivoting the extendable arm 220 to a second pivot position to dispose the sensor 192 above a second window 184 of the lid 182. The position of the extendable arm 220 relative to the base arm 210 may be adjusted to dispose the sensor 192 in a second position above the second window. The sensor 192 is locked in the second position above the second window 184 by inserting the lock pin 290 through the extendable arm 220, the base arm 210, and into a second lock opening 312 formed in the lid 182. The sensor 192 is at the same radial distance from the center of the lid in the second position as in the first position. The sensor 192 may then scan a surface of a pre-heat ring 105, a surface of a substrate support 106, and a gap between the pre-heat ring 105 and the substrate support 106 with the sensor 192 locked in the second position.

FIG. 10 illustrates a flow chart of an exemplary method 1000 of determining an alignment within a process chamber, according to one or more embodiments.

Operation 1003 includes generating a reference alignment profile. In one or more embodiments, the reference alignment profile includes a reference horizontal alignment and a reference vertical alignment.

Operation 1006 includes scanning a region of an interior of a process chamber with a sensor to produce a signal that includes a profile. In one or more embodiments, operation 1006 includes analyzing the signal to identify the profile, and the profile indicates measurements of intensity of light energy (e.g., reflected light) along a radial distance within the process chamber.

Operation 1008 includes comparing the profile to the reference alignment profile to determine if a pre-heat ring and a substrate support are within an acceptable alignment range with respect to each other. In one or more embodiments, the comparing includes comparing a vertical alignment with a reference vertical alignment and comparing a horizontal alignment with a reference horizontal alignment. One or more additional profiles (such as a second profile at a second position) can be produced at operation 1006, and operation 1008 can include comparing the second profile to the reference alignment profile.

Operation 1009 includes determining a first vertical distance between an upper surface of the pre-heat ring and a shoulder surface of the substrate support.

Operation 1010 includes determining a second vertical distance between the upper surface of the pre-heat ring and the upper surface of the substrate support by subtracting the first vertical distance from a first fixed distance.

Operation 1011 includes determining a third vertical distance between the shoulder surface and a pre-heat ring shoulder surface that is separated from the upper surface of the pre-heat ring by a second fixed distance. In one or more embodiments, the third vertical distance is determined by subtracting the first vertical distance from the second fixed distance.

Operation 1013 includes generating an error message if at least a portion of the profile is outside of an error range.

Operation 1015 includes displaying adjustment instructions to bring the substrate support into the acceptable alignment range. If the error message is generated at operation 1013, operation 1015 can include adjusting the alignment of the substrate support relative to the pre-heat ring after the error message was generated, and then operations 1003-1011 can be subsequently conducted after the error is corrected.

The present disclosure contemplates that the subject matter herein can be expressed in one or more of the following Examples.

Example 1: In one or more embodiments, a jig for mounting to a substrate process chamber applicable for use in semiconductor manufacturing includes a base arm, an extendable arm, a sensor mount, and a guide rail assembly. The base arm includes at least one base opening. The extendable arm includes a first opening and a second opening offset from each other by a distance. The first opening is aligned with at least part of the at least one base opening when the extendable arm is in a retracted position, and the second opening is aligned with at least part of the at least one base opening when the extendable arm is in an extended position. The sensor mount is coupled to a first end of the extendable arm. The guide rail assembly includes at least one rail and a carriage. The carriage is engaged with the at least one rail and coupled to the extendable arm. The carriage is moveable along the at least one rail to move the extendable arm between the retracted position and the extended position.

Example 2: In one or more embodiments of the jig of Example 1, the at least one rail comprises a single rail.

Example 3: In one or more embodiments of the jig of Example 2, the at least one base opening includes a first base opening and a second base opening. The first base opening and the second base opening are disposed on opposing sides of the single rail. The first opening is aligned with the first base opening when the extendable arm is in the retracted position and the second opening is aligned with the second base opening when the extendable arm is in the extended position.

Example 4: In one or more embodiments of the jig of Example 3, the first base opening and the second base opening are laterally aligned.

Example 5: In one or more embodiments of the jig of Example 1, the at least one base opening comprises a first base opening, and the first opening is aligned with the first base opening when the extendable arm is in the retracted position and the second opening is aligned with the first base opening when the extendable arm is in the extended position.

Example 6: In one or more embodiments of the jig of Example 1, the jig further includes a rotary joint, wherein the base arm is connectable to the rotary joint at a first end.

Example 7: In one or more embodiments of the jig of Example 1, the first end of the extendable arm is disposed in a mount opening 240 of the sensor mount.

Example 8: In one or more embodiments of the jig of Example 1, a laser sensor is attachable to the sensor mount.

Example 9: In one or more embodiments of the jig of Example 1, further includes lock pin insertable into the aligned at least one base opening and the first opening to lock the extendable arm in the retracted position.

Example 10: In one or more embodiments, an alignment assembly includes a sensor and a lid that includes a first window. The alignment assembly also includes a rotary joint coupled to the lid. The alignment assembly also includes a jig coupled to the rotary joint and pivotable relative to the lid about the rotary joint. The jig includes an extendable arm that is moveable from a retracted position where the sensor is disposed in a first position above the first window to an extended position where the sensor is disposed at a second position above the first window. The alignment assembly also includes a lock configured to selectively pivotably lock the jig to the lid and also to selectively lock the extendable arm in the retracted position or the extended position.

Example 11: In one or more embodiments of the alignment assembly of Example 10, wherein the jig further comprises a base arm connected to the rotary joint at a first end, wherein the base arm comprises at least one base opening. The jig further comprises a guide rail assembly that includes at least one rail and a carriage. The carriage is engaged with the at least one rail and coupled to the extendable arm. The carriage is moveable along the at least one rail to move the extendable arm between the extended position and the retracted position.

Example 12: In one or more embodiments of the alignment assembly of Example 11, the extendable arm comprises a first opening and a second opening offset from each other by a distance. The first opening is aligned with at least part of the at least one base opening when the extendable arm is in the retracted position. The second opening is aligned with at least part of the at least one base opening when the extendable arm is in the extended position.

Example 13: In one or more embodiments of the alignment assembly of Example 11, the at least one base opening comprises a first base opening. The first opening is aligned with the first base opening when the extendable arm is in the retracted position and the second opening is aligned with the first base opening when the extendable arm is in the extended position.

Example 14: In one or more embodiments of the alignment assembly of Example 10, wherein the lid comprises a first lock opening and the lock extends through the jig into the first lock opening to pivotably lock the jig to the lid.

Example 15: In one or more embodiments of the alignment assembly of Example 14, the first lock opening is disposed between the first window and the rotary joint.

Example 16: In one or more embodiments of the alignment assembly of Example 10, the lid comprises a first lock opening, a second lock opening, and a second window. The jig is pivotable relative to the lid from a first pivot position where the sensor is above the first window to a second pivot position where the sensor is above the second window. The lock is configured to be inserted into the jig and into the second lock opening to pivotably lock the jig in the second pivot position.

Example 17: In one or more embodiments, a method of positioning a sensor includes pivoting a jig mounted to a lid of a process chamber to a first pivot position to place a sensor connected to an extendable arm of the jig above a first window of the lid. The method further includes adjusting a position of the extendable arm relative to a base arm of the jig to dispose the sensor at a first position above the first window. The method further includes locking the sensor in the first position above the first window by inserting a lock pin through the extendable arm, the base arm, and into a first lock opening formed in the lid.

Example 18: In one or more embodiments, the method of positioning the sensor of Example 17 further includes unlocking the sensor from the first position by withdrawing the lock pin and pivoting the extendable arm to a second pivot position to dispose the sensor above a second window of the lid.

Example 19: In one or more embodiments, the method of positioning the sensor of Example 18 further includes adjusting the position of the extendable arm relative to the base arm to dispose the sensor in a second position above the second window. The method further includes locking the sensor in the second position above the second window by inserting the lock pin through the extendable arm, the base arm, and into a second lock opening formed in the lid.

Example 20: In one or more embodiments, the method of positioning the sensor of Example 17 further include scanning a surface of a pre-heat ring, a surface of a substrate support, and a gap between the pre-heat ring and the substrate support with the sensor locked in the first position.

Example 21: In one or more embodiments, a method of determining an alignment within a process chamber includes generating a reference alignment profile. The method further includes scanning a region of an interior of a process chamber with a sensor to produce a signal that includes a profile, the profile including a first segment separated from a second segment by a third segment, the third segment is a drop in the signal, the first segment corresponding to an upper surface of a substrate support, the second segment corresponding to an upper surface of a pre-heat ring, and the drop corresponding to a gap between the pre-heat ring and the substrate support. The method further includes, comparing the profile to the reference alignment profile to determine if the pre-heat ring and the substrate support are within an acceptable alignment range with respect to each other.

Example 22: In one or more embodiments, the method of determining the alignment of Example 21 includes displaying adjustment instructions to bring the substrate support into the acceptable alignment.

Example 23: In one or more embodiments, the method of determining the alignment of Example 21 includes determining a width of the gap by measuring a width of the third segment, wherein the width of the gap indicates a horizontal alignment of the substrate support relative to the pre-heat ring.

Example 24: In one or more embodiments, the method of determining the alignment of Example 23 further includes determining a vertical alignment of the upper surface of the substrate support relative to the upper surface of the pre-heat ring by measuring a vertical distance between the first segment and the second segment.

Example 25: In one or more embodiments of the method of determining the alignment of Example 24, the reference alignment profile comprises a reference horizontal alignment and a reference vertical alignment of the substrate support relative to the pre-heat ring. The method further includes comparing the profile to the reference alignment profile comprises comparing the vertical alignment with the reference vertical alignment and comparing the horizontal alignment with the reference horizontal alignment.

Example 26: In one or more embodiments, the method of determining the alignment of Example 24 further includes determining a first vertical distance between the upper surface of the pre-heat ring and a shoulder surface of the substrate support by measuring a vertical distance between the first segment and the third segment, wherein the shoulder surface is separated from the upper surface of the substrate support by a first fixed distance. The method further includes determining a second vertical distance between the upper surface of the pre-heat ring and the upper surface of the substrate support by subtracting the first vertical distance from the first fixed distance.

Example 27: In one or more embodiments of the method of determining the alignment of Example 26, the reference alignment profile comprises a reference horizontal alignment and a reference vertical alignment of the substrate support relative to the pre-heat ring, wherein the reference vertical alignment is a reference distance between the upper surface substrate support and the upper surface of the pre-heat ring. The method further includes comparing the profile to the reference alignment profile comprises comparing the second vertical distance with the reference distance and comparing the horizontal alignment with the reference horizontal alignment.

Example 28: In one or more embodiments, the method of determining the alignment of Example 26 and/or Example 27 further includes determining a third vertical distance between the shoulder surface and a pre-heat ring shoulder surface that is separated from the upper surface of the pre-heat ring by a second fixed distance, where the third vertical distance is determined by subtracting the first vertical distance from the second fixed distance.

Example 29: In one or more embodiments, the method of determining the alignment of Example 21 further includes analyzing the signal to identify the profile, the profile indicating measurements of intensity of light energy along a radial distance within the process chamber.

Example 30: In one or more embodiments, the method of determining the alignment of Example 21 further includes generating an error message if at least a portion of the profile is outside of an error range. The method further includes adjusting the alignment of the substrate support relative to the pre-heat ring after the error message was generated.

Example 31: In one or more embodiments of the method of determining the alignment of Example 21, the region is a first region below the sensor in a first position, the signal is a first signal, and the profile is a first profile. The method further includes moving the sensor to a second position above a second region of the interior of the process chamber. The method further includes scanning the second region with the sensor to produce a second signal comprising a second profile.

Example 32: In one or more embodiments of the method of determining the alignment of Example 31, comparing the profile to the reference alignment profile to determine if the pre-heat ring and substrate support are within the alignment range comprises comparing the first profile and the second profile to the reference alignment profile.

The disclosure contemplates that terms such as “couples,” “couplable,” “coupling,” “couple,” and “coupled” may include but are not limited to welding, fusing, melting together, interference fitting, and/or fastening such as by using bolts, nuts, threaded connections, pins, and/or screws. The disclosure contemplates that terms such as “couples,” “couplable,” “coupling,” “couple,” and “coupled” may include but are not limited to integrally forming. The disclosure contemplates that terms such as “couples,” “couplable,” “coupling,” “couple,” and “coupled” may include but are not limited to direct coupling and/or indirect coupling, such as indirect coupling through components such as links, blocks, and/or frames.

Benefits of the present disclosure include accurately, simply, and effectively measuring and adjusting alignment of substrate supports relative to chamber components (such as pre-heat rings) in a manner that is modular across a variety of configurations for substrate supports and pre-heat rings, and in a manner that is modular across a variety of chamber configurations.

It is contemplated that aspects described herein can be combined. For example, one or more features, aspects, components, operations, and/or properties of the process chamber 100, the jig 190, the sensor 192, the controller 120, the alignment assembly 300, the signal 501, the first profile 510, the reference alignment profile 530, the signal 701, the profile 710, the reference alignment profile 730, the user interface 800, the second user interface 860, the method 900, the method 1000, and/or one or more of Examples 1-32 can be combined. It is further contemplated that any combination(s) can achieve the benefits described herein.

While the foregoing is directed to embodiments of the present disclosure, other and further embodiments of the disclosure may be devised without departing from the basic scope thereof, and the scope thereof is determined by the claims that follow.

What is claimed is:

1. A jig for mounting to a substrate process chamber applicable for use in semiconductor manufacturing, comprising:

a base arm comprising at least one base opening;

an extendable arm comprising a first opening and a second opening offset from each other by a distance, the first opening is aligned with at least part of the at least one base opening when the extendable arm is in a retracted position, and the second opening is aligned with at least part of the at least one base opening when the extendable arm is in an extended position;

a sensor mount coupled to a first end of the extendable arm; and a guide rail assembly, comprising:

at least one rail;

a carriage engaged with the at least one rail and coupled to the extendable arm, the carriage is moveable along the at least one rail to move the extendable arm between the retracted position and the extended position.

2. The jig of claim 1, wherein the at least one rail comprises a single rail.

3. The jig of claim 2, wherein:

the at least one base opening comprises a first base opening and a second base opening, the first base opening and the second base opening are disposed on opposing sides of the single rail, and the first opening is aligned with the first base opening when the extendable arm is in the retracted position and the second opening is aligned with the second base opening when the extendable arm is in the extended position.

4. The jig of claim 3, wherein the first base opening and the second base opening are laterally aligned.

5. The jig of claim 1, wherein the at least one base opening comprises a first base opening, and the first opening is aligned with the first base opening when the extendable arm is in the retracted position and the second opening is aligned with the first base opening when the extendable arm is in the extended position.

6. The jig of claim 1, further comprising:

a rotary joint, wherein the base arm is connectable to the rotary joint at a first end.

7. The jig of claim 1, wherein the first end of the extendable arm is disposed in a mount opening of the sensor mount.

8. The jig of claim 1, wherein a laser sensor is attachable to the sensor mount.

9. The jig of claim 1, further comprising:

a lock pin insertable into the aligned at least one base opening and the first opening to lock the extendable arm in the retracted position.

10. An alignment assembly, comprising:

a sensor;

a lid comprising a first window;

a rotary joint coupled to the lid;

a jig coupled to the rotary joint and pivotable relative to the lid about the rotary joint, the jig comprising:

a base arm comprising at least one base opening;

an extendable arm that is moveable:

from a retracted position where the sensor is disposed in a first position above the first window, and to an extended position where the sensor is disposed at a second position above the first window, the extendable arm comprising a first opening and a second opening offset from each other by a distance, the first opening is aligned with at least part of the at least one base opening when the extendable arm is in the retracted position, and the second opening is aligned with at least part of the at least one base opening when the extendable arm is in the extended position;

a sensor mount coupled to a first end of the extendable arm; and a guide rail assembly, comprising:

at least one rail;

a carriage engaged with the at least one rail and coupled to the extendable arm, the carriage is moveable along the at least one rail to move the extendable arm between the retracted position and the extended position; and a lock configured to selectively pivotably lock the jig to the lid and also to selectively lock the extendable arm in the retracted position or the extended position.

11. The alignment assembly of claim 10, wherein the jig further comprises:

the base arm connected to the rotary joint at a first end.

12. The alignment assembly of claim 11, wherein the at least one base opening comprises a first base opening, wherein the first opening is aligned with the first base opening when the extendable arm is in the retracted position and the second opening is aligned with the first base opening when the extendable arm is in the extended position.

13. The alignment assembly of claim 10, wherein the lid comprises a first lock opening and the lock extends through the jig into the first lock opening to pivotably lock the jig to the lid.

14. The alignment assembly of claim 13, wherein the first lock opening is disposed between the first window and the rotary joint.

15. The alignment assembly of claim 10, wherein:

the lid comprises a first lock opening, a second lock opening, and a second window, wherein the jig is pivotable relative to the lid from a first pivot position where the sensor is above the first window to a second pivot position where the sensor is above the second window, and wherein the lock is configured to be inserted into the jig and into the second lock opening to pivotably lock the jig in the second pivot position.

* * * * *